(12) United States Patent
Okada et al.

(10) Patent No.: US 8,106,581 B2
(45) Date of Patent: Jan. 31, 2012

(54) ORGANIC ELECTROLUMINESCENCE ELEMENT HAVING CONCENTRATION VARIATION OF HOLE TRANSPORTING LIGHT-EMITTING MATERIAL

(75) Inventors: Hisashi Okada, Kanagawa (JP);
Manabu Tobise, Kanagawa (JP);
Masaru Kinoshita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 287 days.

(21) Appl. No.: 12/178,445

(22) Filed: Jul. 23, 2008

(65) Prior Publication Data

US 2009/0026938 A1 Jan. 29, 2009

(30) Foreign Application Priority Data

Jul. 27, 2007 (JP) ................. 2007-196676

(51) Int. Cl.
*H01L 51/52* (2006.01)
*H01L 51/54* (2006.01)
(52) U.S. Cl. .......... 313/504; 313/506; 313/507; 445/24; 445/25; 428/690; 428/917
(58) Field of Classification Search ........... 313/500–512
See application file for complete search history.

(56) References Cited

U.S. PATENT DOCUMENTS

| 6,603,150 B2 | 8/2003 | Liao et al. |
| 2003/0075720 A1 | 4/2003 | Liao et al. |
| 2005/0260440 A1* | 11/2005 | Seo et al. ...................... 428/690 |
| 2007/0052351 A1* | 3/2007 | Kim et al. ..................... 313/506 |

FOREIGN PATENT DOCUMENTS

| JP | 6-310275 A | 11/1994 |
| JP | 8-162273 A | 6/1996 |
| JP | 2001-155862 A | 6/2001 |
| JP | 2001-189193 A | 7/2001 |
| JP | 2002-313583 A | 10/2002 |
| JP | 2003-123984 A | 4/2003 |
| JP | 2004-6102 A | 1/2004 |
| JP | 2007-42875 A | 2/2007 |

OTHER PUBLICATIONS

Tsuji et al., Japanese Patent Application Publication 2006-319070, Nov. 2006, machine translation.*
"Science," vol. 267, No. 3, pp. 1332-1334, (1995).
Notice of Reasons for Rejection issued in Japanese Patent Application No. 2007-196676 on Oct. 4, 2011 with English Translation.

* cited by examiner

*Primary Examiner* — Anne Hines
*Assistant Examiner* — Tracie Green
(74) *Attorney, Agent, or Firm* — Birch, Stewart, Kolasch & Birch, LLP

(57) ABSTRACT

An organic electroluminescence element including an organic layer including a light-emitting layer disposed between a pair of electrodes, wherein the light-emitting layer contains at least one hole transporting light-emitting material and at least one electron-transporting host material, and a concentration of the hole transporting light-emitting material in the light-emitting layer decreases from an anode side toward a cathode side.

13 Claims, No Drawings

ORGANIC ELECTROLUMINESCENCE ELEMENT HAVING CONCENTRATION VARIATION OF HOLE TRANSPORTING LIGHT-EMITTING MATERIAL

CROSS-REFERENCE TO RELATED APPLICATION

This application claims priority under 35 USC 119 from Japanese Patent Application No. 2007-196676, the disclosure of which is incorporated by reference herein.

BACKGROUND OF THE INVENTION

1. Field of the Invention

The present invention relates to an organic electroluminescence element. In particular, the invention relates to an organic electroluminescence element with high light-emission efficiency and excellent durability.

2. Description of the Related Art

An organic electroluminescence element (hereinafter, referred to as an "organic EL element" in some cases) is composed of a light-emitting layer or a plurality of functional organic layers containing a light-emitting layer, and a pair of electrodes sandwiching these layers. The organic EL element is a device for obtaining luminescence by utilizing at least either one of luminescence from excitons each of which is obtained by recombining an electron injected from a cathode with a hole injected from an anode to produce the exciton in the light-emitting layer, or luminescence from excitons of other molecules produced by energy transmission from at least one of the above-described excitons.

Heretofore, an organic EL element has been developed by using a laminate structure from integrated layers in which each layer is functionally differentiated, whereby brightness and device efficiency are remarkably improved. For example, "Science", vol. 267, No. 3, page 1332, (1995) discloses a two-layer laminated type device obtained by laminating a hole transport layer and a light-emitting layer also functioning as an electron transport layer; a three-layer laminated type device obtained by laminating a hole transport layer, a light-emitting layer, and an electron transport layer; and a four-layer laminated type device obtained by laminating a hole transport layer, a light-emitting layer, a hole blocking layer, and an electron transport layer.

However, many problems still remain for putting organic EL elements to practical use. First, there is a need to attain high light-emission efficiency, and second, there is a need to attain high drive durability. In particular, deterioration in quality during continuous driving is a most significant problem.

For example, Japanese Patent Application Laid-Open (JP-A) No. 2003-123984 discloses an attempt to dispose an interface layer of 0.1 nm to 5 nm as a barrier layer between a light-emitting layer and a hole transport layer and retard the migration of holes, to thereby control the migration balance between holes and electrons and enhance the external quantum efficiency. However, this means potentially involves a problem of lowering the brightness and increasing the driving voltage since the migration of all of the carriers is lowered, as well as a problem of lowering the drive durability, since the time that the carriers stay in the device is made longer.

Further, a configuration in which light emitting units each containing a light-emitting layer and a functional layer are stacked in a multilayer structure (which is referred to as "multi-photon") is known. For example, JP-A No. 6-310275 discloses a configuration in which plural light emitting units including an organic electroluminescence element are isolated by an insulating layer, and opposing electrodes are provided for each of the light emitting units. However, in this configuration, since the insulating layer and the electrode between the light emitting units hinder the extraction of emitted light, the light emitted from each of the light emitting units cannot substantially be utilized sufficiently. Further, this is not a means for improving the low external quantum efficiency inherent to each of the light emitting units. For example, JP-A No. 8-162273 discloses a similar configuration in which plural light emitting units are stacked and isolated by an insulating layer in an inorganic light-emitting element (hereinafter, referred to as an "inorganic EL element" in some cases). However, in this configuration as well, since plural light emitting units are merely stacked, this is not a means for improving the low external quantum efficiency inherent to each of the light emitting units.

In the case of a polymer dispersion type light-emitting element, since a light-emitting layer generally has a monolayer configuration, light-emitting sites are dispersed in the light-emitting layer. Therefore, there has been a problem in that it is difficult to achieve a balance between injection and transport of a hole and an electron, whereby the recombination efficiency is reduced. As a means for improving this problem, JP-A No. 2001-189193 discloses that in a light-emitting layer, both the concentration of a light-emitting material and the concentration of a charge transport material are made low on the anode side and high on the cathode side, respectively, thereby causing light emission intensively in a region on the cathode side. Though this means is effective against peculiar problems in the polymer dispersion type light-emitting element, the light-emitting region is located in only a part of the region on the cathode side, and the whole of the light-emitting layer is not effectively utilized. Therefore, it may be said that this is not an overall enhancement of the light-emission efficiency.

Also, in the case where an organic EL element is of a laminate structure, carrier injectability is reduced due to a barrier between the respective layers, and there are problems of an increase in driving voltage and a reduction in durability. As a means for reducing such a barrier between the respective layers, JP-A No. 2002-313583 proposes to provide a gradation in the concentration in the respective layers of a hole injection material, an electron injection material, a hole transport material or an electron transport material contained in the respective layers. In such a configuration, a light-emitting material in a light-emitting layer is disposed in a restricted region in the light-emitting layer which is formed of a bipolar mixed layer. Even in this configuration, light emission takes place only in the restricted region where the light-emitting material is disposed.

As a means for improving the deterioration in brightness when an organic EL element is continuously driven, JP-A No. 2004-6102 discloses that a mixing ratio of a host material and a guest material of a light-emitting layer is regulated at 100% in terms of the guest material at an interface between a light-emitting layer and a hole transport layer, thereby decreasing the concentration of the guest material on the side of an electron transport layer. It is described that the guest material is a light-emitting material and that by distributing the light-emitting material in a high concentration at the interface between the light-emitting layer and the hole transport layer, concentration quenching is improved. However, even in this configuration, the light emission takes place only in a restricted region where the light-emitting material is disposed. A light-emitting region which does not contribute to the light emission remains, and the problem that the light-emission efficiency is low remains unsolved.

In designing a practically useful organic EL element, it is an extremely important problem to make high external quantum efficiency and high drive durability compatible with each other. This problem is a problem which is always required to be improved.

SUMMARY OF THE INVENTION

The present invention has been made in view of the above circumstances and provides an organic electroluminescence element with the following aspect.

An aspect of the invention provides an organic electroluminescence element comprising an organic layer comprising a light-emitting layer disposed between a pair of electrodes, wherein the light-emitting layer comprises at least one hole transporting light-emitting material and at least one electron-transporting host material, and a concentration of the hole transporting light-emitting material in the light-emitting layer decreases from an anode side toward a cathode side.

DETAILED DESCRIPTION OF THE INVENTION

An object of the present invention is to provide an organic EL element with high light-emission efficiency and excellent durability.

The problem of the present invention described above has been solved by the following means.

The organic electroluminescence element of the present invention is characterized in that it comprises an organic layer comprising a light-emitting layer disposed between a pair of electrodes, wherein the light-emitting layer comprises at least one hole transporting light-emitting material and at least one electron-transporting host material, and a concentration of the hole transporting light-emitting material in the light-emitting layer decreases from an anode side toward a cathode side.

Preferably, a ratio of the concentration of the hole transporting light-emitting material in an interface region of the light-emitting layer on the cathode side relative to the concentration of the hole transporting light-emitting material in an interface region of light-emitting layer on the anode side (concentration of hole transporting light-emitting material in interface region on cathode side/concentration of hole transporting light-emitting material in interface region on anode side) is from 0% to 30%.

Preferably, the concentration of the hole transporting light-emitting material in the light-emitting layer is 10% by weight or less in the interface region of the light-emitting layer on the cathode side.

Preferably, the hole transporting light-emitting material is a phosphorescent light-emitting material. More preferably, the hole transporting light-emitting material is an Ir complex.

Preferably, the electron-transporting host material is a Be complex, an Al complex, a Ga complex, a Zn complex, a Pt complex, a Pd complex or a nitrogen-containing aromatic heterocyclic compound.

Preferably, the concentration of the electron-transporting host material in the light-emitting layer decreases from the cathode side toward the anode side.

Preferably, a ratio of the concentration of the electron-transporting host material in an interface region of the light-emitting layer on the anode side relative to the concentration of the electron-transporting host material in an interface region of the light-emitting layer on the cathode side (concentration of the electron-transporting host material in the interface region on the anode side/concentration of the electron-transporting host material in the interface region on the cathode side) is from 0% to 90%.

Preferably, the concentration of the electron-transporting host material in the light-emitting layer is 90% by weight or less in the interface region of the light-emitting layer on the anode side.

According to the present invention, there is provided an organic EL element with high light-emission efficiency and excellent durability. In particular, there is provided an organic EL element using a phosphorescent light-emitting material, which is high in light-emission efficiency, is free from a reduction in light-emission efficiency even in a high current region, and has high light-emission efficiency and excellent drive durability over a wide region from a low current region to a high current region.

The organic electroluminescence element of the invention is characterized in that it comprises an organic layer comprising a light-emitting layer disposed between a pair of electrodes, wherein the light-emitting layer comprises at least one hole transporting light-emitting material and at least one electron-transporting host material, and a concentration of the hole transporting light-emitting material in the light-emitting layer decreases from an anode side toward a cathode side.

A concentration of the electron-transporting host material in the light-emitting layer preferably decreases from the cathode side toward the anode side.

The concentration gradation of the hole transporting light-emitting material is preferably such that the concentration of the hole transporting light-emitting material in an interface region of the light-emitting layer on the cathode side is from 0% to 30% with respect to the concentration of the hole transporting light-emitting material in the interface region on the anode side, more preferably from 0% to 20%, and even more preferably from 0% to 10%.

A concentration gradation of the electron-transporting host material is preferably such that the concentration of the electron-transporting host material in the interface region of the light-emitting layer on the anode side is from 0% to 90% with respect to the concentration of the electron-transporting host material in the interface region on the cathode side, more preferably from 0% to 87%, and even more preferably from 0% to 85%.

In the specification of this application, the term "interface region of the light-emitting layer on the cathode side" is defined to refer to a region extending to a thickness of 10% of the thickness of the whole of the light-emitting layer from the interface on the cathode side of the light-emitting layer; and the term "interface region of the light-emitting layer on the anode side" is defined to refer to a region extending to a thickness of 10% of the thickness of the whole of the light-emitting layer from the interface on the anode side of the light-emitting layer. Also, the concentration in that region is defined to refer to an average concentration in that region.

In the invention, the term "concentration gradation" means that the concentration decreases or increases on the whole. The concentration gradation may change continuously, or may change stepwise or in a wave pattern. Alternatively, for example, in the case of a decreasing concentration gradation, even when a region where the concentration locally increases in the layer exists, the case where a generally decreasing concentration gradation is present should be construed to fall within the intended scope of this application.

Heretofore, in a case where the concentration of the hole transporting light-emitting material in the light-emitting layer has no gradation, there has been a phenomenon that light emission occurs only in a local region on the cathode side of the light-emitting layer and light emission does not occur in a central portion of the light-emitting layer. In the organic EL element of the invention, since light emission occurs over the entire region of the light-emitting layer due to adoption of the gradation structure in the light-emitting layer, the emission efficiency is increased and the drive durability is improved remarkably. This is considered to be attributable to the fact that, according to the configuration of the light emitting layer of the present invention, a large amount of holes is injected into the light-emitting layer, and as the concentration of the hole transporting light-emitting material is lowered as the injected holes move toward the electron transport layer (toward the cathode) to result in suppressing of a mobility of the holes, recombination at the central portion of the light-emitting layer is facilitated. Further, since localization of excitons to the local portion near the boundary between the light-emitting layer and the adjacent layer is suppressed, an effect of suppressing the lowering of emission efficiency at a high brightness can also be obtained.

The concentration of the hole transporting light-emitting material in the light-emitting layer is preferably 10% by weight or less in the interface region of the light-emitting layer on the cathode side, more preferably 7% by weight or less, and even more preferably 5% by weight or less. The concentration of the electron-transporting host material in the light-emitting layer is preferably 90% by weight or less in the interface region of the light-emitting layer on the anode side, more preferably 87% by weight or less, and even more preferably 85% by weight or less.

In a case where the concentration of the hole transporting light-emitting material or the electron-transporting host material exceeds the range described above, no effective gradation can be obtained, and thereby the effect of the present invention cannot be obtained sufficiently.

The concentration for each of the materials in the interface region of the light-emitting layer on the cathode (or anode) side can be measured by a method, for example, of time-of-flight secondary ion mass spectrometry (TOF-SIMS), or etching X-ray photoelectron spectroscopic analysis (XPS/ESCA), etc.

Preferably, the hole transporting light-emitting material is a phosphorescent light-emitting material. More preferably, the hole transporting light-emitting material is an Ir complex.

Preferably, the electron-transporting host material is a Be complex, Al complex, Ga complex, Zn complex, Pt complex, or Pd complex having a nitrogen-containing aromatic heterocyclic ligand.

1. Constitution of Organic EL Element

As an integration pattern of the organic compound layer according to the present invention, it is preferred that the layer includes a hole transport layer, a light-emitting layer, and an electron transport layer in this order from the anode side. Moreover, at least one of a hole injection layer between the hole transport layer and the anode or an electron transporting intermediate layer between the light-emitting layer and the electron transport layer is provided. In addition, a hole transporting intermediate layer may be provided between the light-emitting layer and the hole transport layer, and similarly, an electron injection layer may be provided between the cathode and the electron transport layer.

The preferred modes of the organic compound layer in the organic electroluminescence element of the present invention are as follows. (1) An embodiment having a hole injection layer, a hole transport layer (the hole injection layer may also have the role of the hole transport layer), a hole transporting intermediate layer, a light-emitting layer, an electron transport layer, and an electron injection layer (the electron transport layer may also have the role of the electron injection layer) in this order from the anode side; (2) an embodiment having a hole injection layer, a hole transport layer (the hole injection layer may also have the role of the hole transport layer), a light-emitting layer, an electron transporting intermediate layer, an electron transport layer, and an electron injection layer (the electron transport layer may also have the role of the electron injection layer) in this order from the anode side; and (3) an embodiment having a hole injection layer, a hole transport layer (the hole injection layer may also have the role of the hole transport layer), a hole transporting intermediate layer, a light-emitting layer, an electron transporting intermediate layer, an electron transport layer, and an electron injection layer (the electron transport layer may also have the role of the electron injection layer) in this order from the anode side.

The above-described hole transporting intermediate layer preferably has at least either a function for accelerating the injection of holes into the light-emitting layer, or a function for blocking electrons.

Furthermore, the above-described electron transporting intermediate layer preferably has at least either a function for accelerating the injection of electrons into the light-emitting layer, or a function for blocking holes.

Moreover, at least one of the above-described hole transporting intermediate layer or the electron transporting intermediate layer preferably has a function for blocking excitons produced in the light-emitting layer.

In order to realize effectively the functions for accelerating the injection of holes, or the injection of electrons, and the functions for blocking holes, electrons, or excitons, it is preferred that the hole transporting intermediate layer and the electron transporting intermediate layer are adjacent to the light-emitting layer.

The respective layers mentioned above may be separated into a plurality of secondary layers.

The organic EL element in the invention may have a resonator structure. For example, on a transparent substrate, a multi-layered film mirror comprising a plurality of stacked films of different reflective indexes, a transparent or semi-transparent electrode, a light-emitting layer, and a metal electrode stacked to each other are provided. The light generated in the light-emitting layer repeats reflection and conducts oscillation between the multi-layered film mirror and the metal electrode as reflection plates.

In another preferred embodiment of the resonator structure, a transparent or semi-transparent electrode and a metal electrode function respectively as reflection plates on a transparent substrate in which light generated in the light-emitting layer repeats reflection and conducts oscillation therebetween.

For forming the resonance structure, an optical channel length determined based on the effective refractive index of two reflection plates, and the refractive index and the thickness of each of the layers between the reflection plates are controlled to optimal values for obtaining a desired resonance wavelength. A calculation formula in the case of the first embodiment is described in the specification of JP-A No. 9-180883 and the calculation formula in the case of the second embodiment is described in the specification of JP-A No. 2004-127795.

The respective layers constituting the organic compound layers can be suitably formed in accordance with any of a dry film-forming method such as a vapor deposition method, or a sputtering method; a transfer method; a printing method; a coating method; an ink-jet method; or a spray method.

Hereinafter, the constituent components of the organic EL element of the invention are described in detail.

2. Light-Emitting Layer

The light-emitting layer is a layer having a function for receiving holes from the anode, the hole injection layer, the hole transport layer or the hole transporting intermediate layer, and receiving electrons from the cathode, the electron injection layer, the electron transport layer, or the electron transporting intermediate layer, and for providing a field for recombination of the holes with the electrons to emit light.

The light-emitting layer in the invention is characterized in that it has at least one hole transporting light-emitting material and at least one electron-transporting host material, in which a concentration of the hole transporting light-emitting material in the light-emitting layer decreases from the anode side toward the cathode side.

A concentration of the electron-transporting host material in the light-emitting layer preferably decreases from the cathode side toward the anode side.

The light-emitting layer in the invention may also contain other light-emitting materials and host materials. For example, the light-emitting layer may contain an electron transporting light-emitting material or a hole transporting host material appropriately.

A total amount of the light-emitting materials is preferably from 0.1% by weight to 30% by weight with respect to the entire amount of compounds contained in the light-emitting layer, and more preferably from 1% by weight to 15% by weight from the viewpoints of durability and external quantum efficiency. A total amount of the host material in the light-emitting layer is preferably from 70% by weight to 99.9% by weight, and more preferably from 85% by weight to 99% by weight from the viewpoints of durability and external quantum efficiency.

The light-emitting material and the host material contained in the light-emitting layer of the invention may be a combination of a fluorescent light-emitting material capable of obtaining light emission from a singlet exciton (fluorescence) and a host material, or a combination of a phosphorescent light-emitting material capable of obtaining light emission from a triplet exciton (phosphorescence) and a host material. A combination of a phosphorescent light-emitting material and an electron-transporting host material is preferred.

(Hole Transporting Light-Emitting Material)

The hole transporting light-emitting material in the invention is hereunder described.

From the viewpoints of enhancing durability and reducing driving voltage, the hole transporting light-emitting material to be used in the light-emitting layer of the invention preferably has an ionization potential (Ip) of from 5.1 eV to 6.4 eV, more preferably from 5.4 eV oto 6.2 eV, and even more preferably from 5.6 eV to 6.0 eV. Also, from the viewpoints of enhancing durability and reducing driving voltage, the hole transporting light-emitting material to be used in the light-emitting layer of the invention preferably has an electron affinity (Ea) of from 1.2 eV to 3.1 eV, more preferably from 1.4 eV to 3.0 eV, and even more preferably from 1.8 eV to 2.8 eV.

Specific examples of the hole transporting light-emitting material include pyrrole based compounds, indole based compounds, carbazole based compounds, imidazole based compounds, polyarylalkane based compounds, arylamine based compounds, styryl based compounds, styrylamine based compounds, thiophene based compounds, aromatic polycyclic condensed-type compounds, metal complexes, and the like.

Though a metal ion in the foregoing metal complex is not particularly limited, from the viewpoints of enhancing light-emission efficiency, enhancing durability and reducing driving voltage, the metal ion is preferably a transition metal ion or a rare earth metal ion; more preferably an iridium ion, a platinum ion, a gold ion, a rhenium ion, a tungsten ion, a rhodium ion, a ruthenium ion, an osmium ion, a palladium ion, a silver ion, a copper ion, a cobalt ion, a nickel ion, a lead ion or a rare earth metal ion (for example, an europium ion, a gadolinium ion, a terbium ion, or the like); even more preferably an iridium ion, a platinum ion, a gold ion, a rhenium ion, a tungsten ion, an europium ion, a gadolinium ion or a terbium ion; particularly preferably an iridium ion, a platinum ion, a rhenium ion, an europium ion, a gadolinium ion or a terbium ion; and most preferably an iridium ion. Among iridium ion-containing metal complexes, metal complexes having a carbon-Ir bond or a nitrogen-Ir bond (in that case, the bond may be any of a coordination bond, an ionic bond or a covalent bond) are especially preferable.

Specific examples of the hole transporting light-emitting material include the following materials, but it should be noted that the present invention is not limited to these materials.

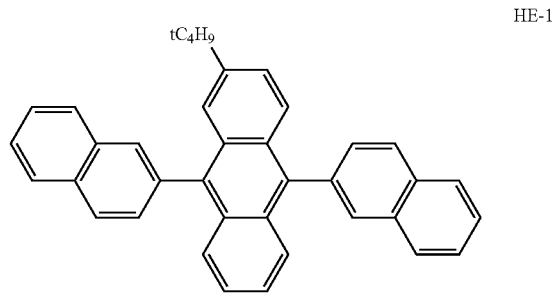

HE-1

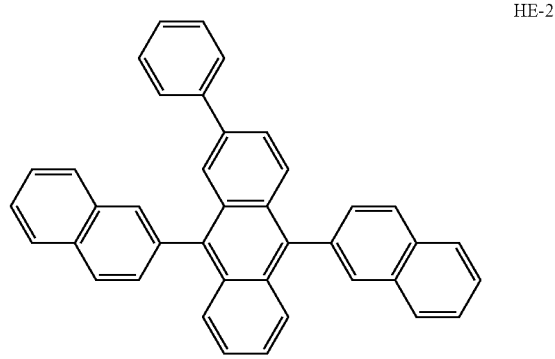

HE-2

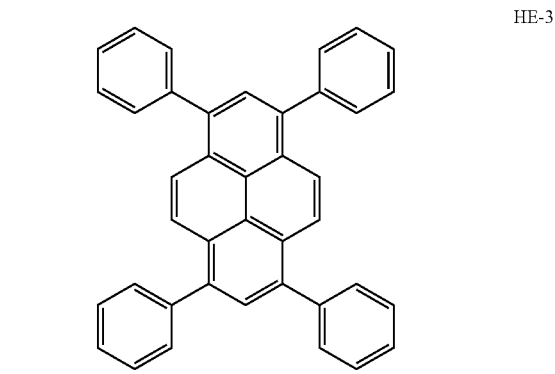

HE-3

HE-4
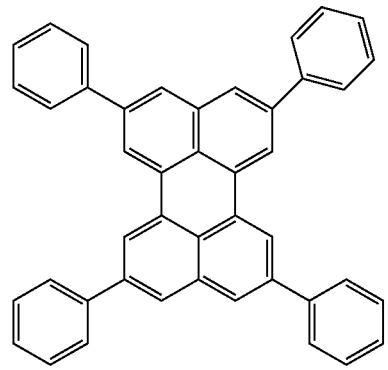
HE-5
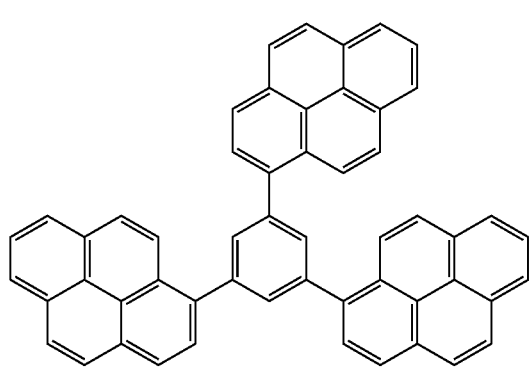
HE-6
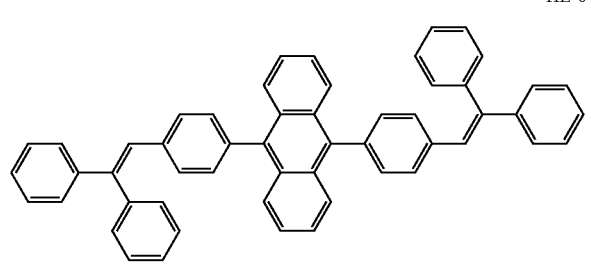
HE-7
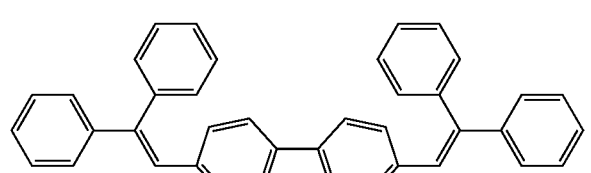
HE-8
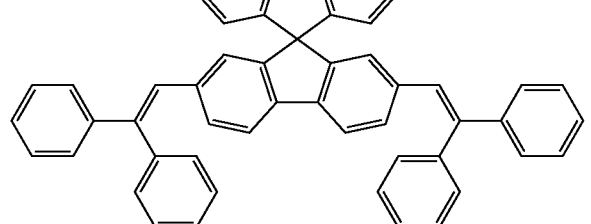
HE-9
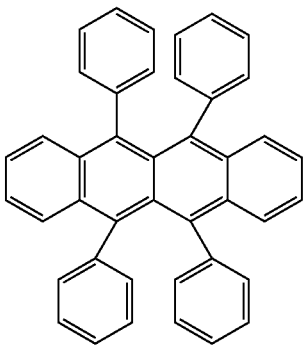
HE-10
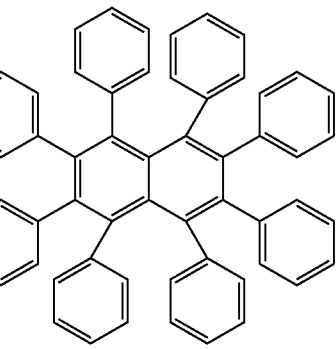
HE-11
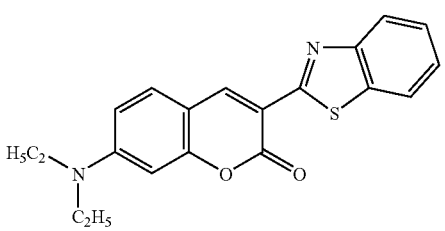
HE-12
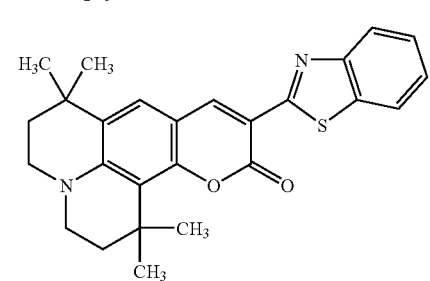
HE-13
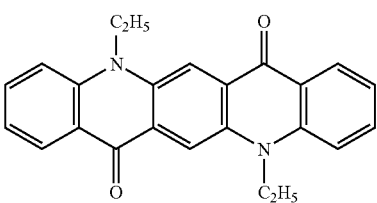
HE-14
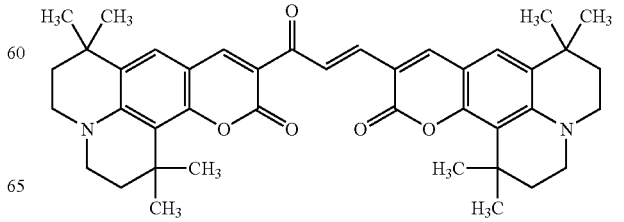

HE-15
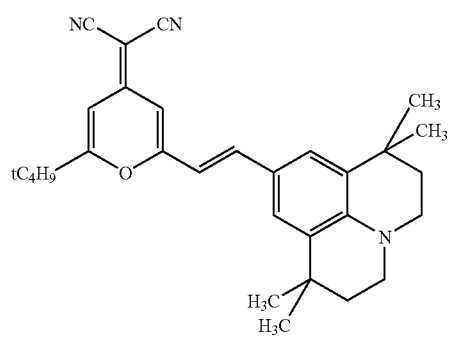
HE-20
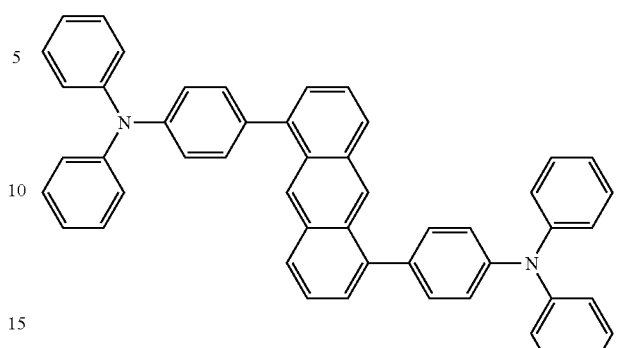
HE-16
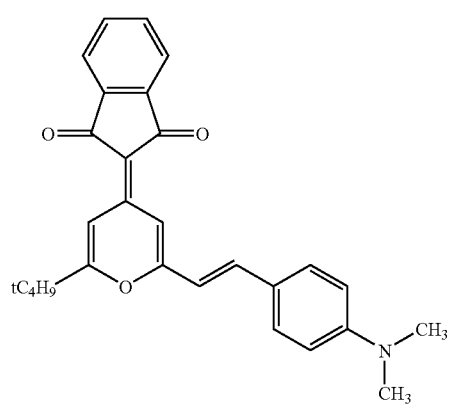
HE-21
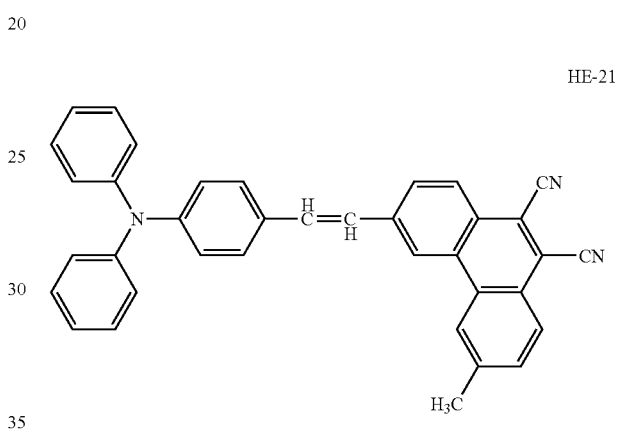
HE-17
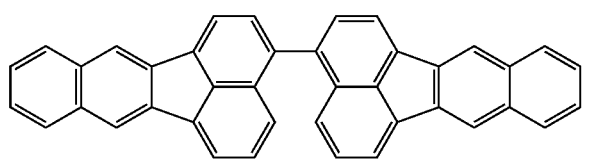
HE-18
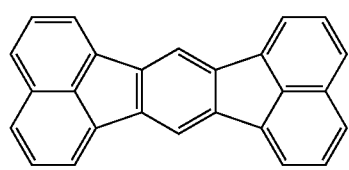
HE-22
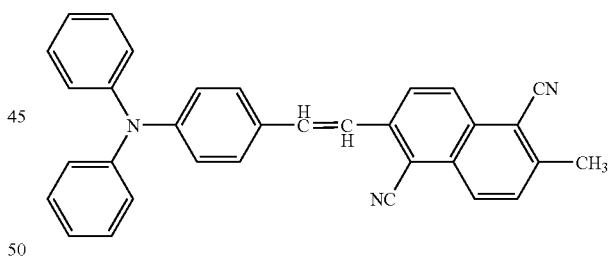
HE-19
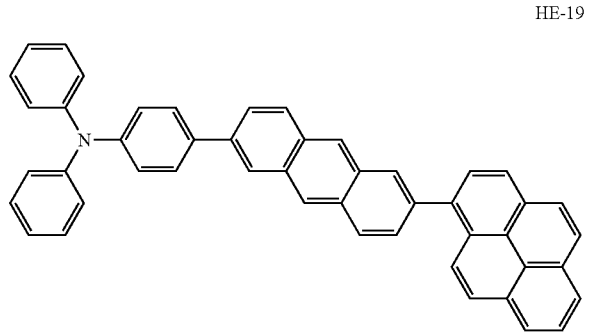
HE-23
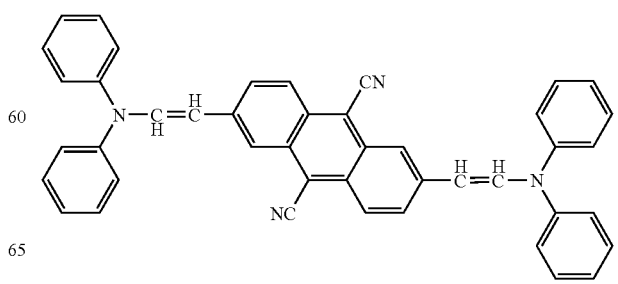

HE-24
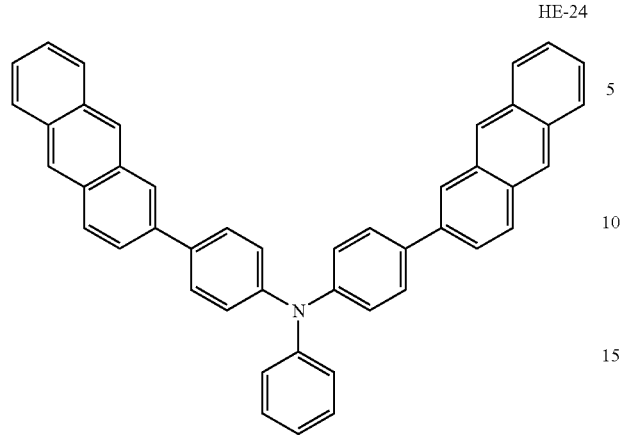
HE-25
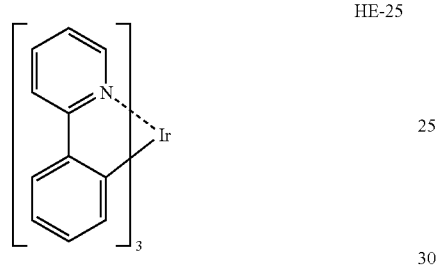
HE-26
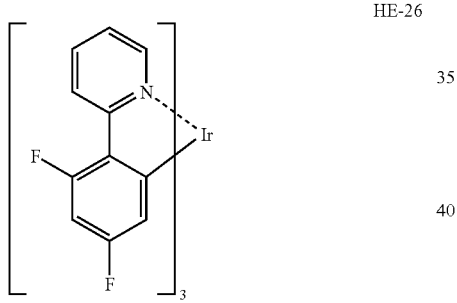
HE-27
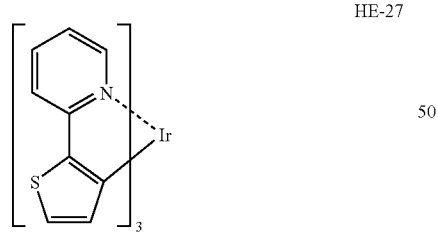
HE-28
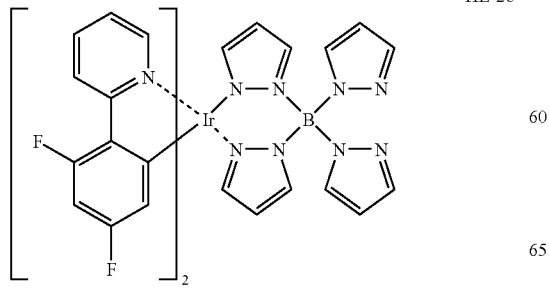
HE-29
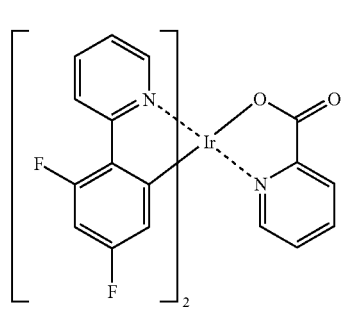
HE-30
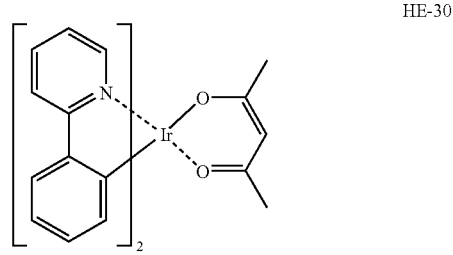
HE-31
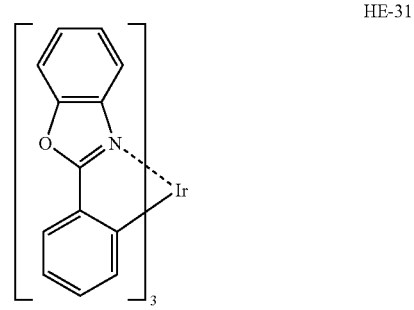
HE-32
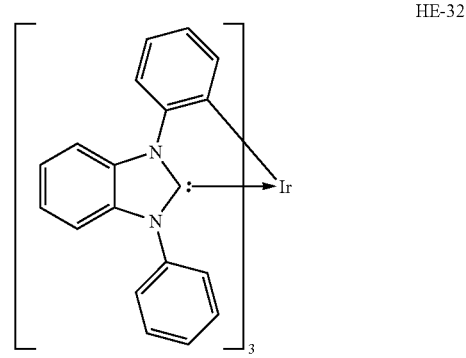
HE-33
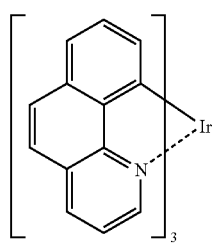

HE-34
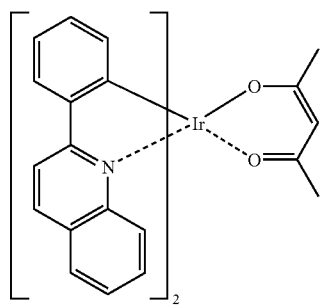
HE-35
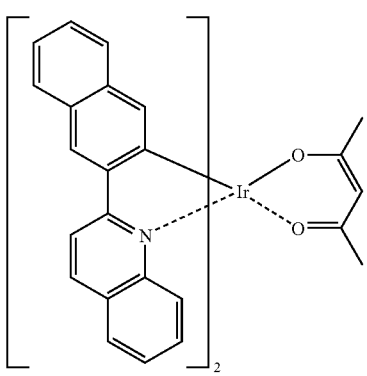
HE-36
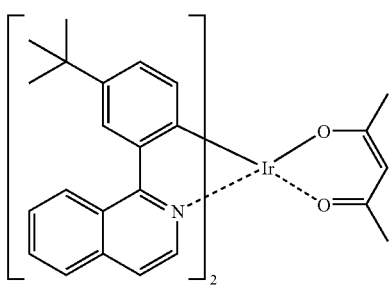
HE-37
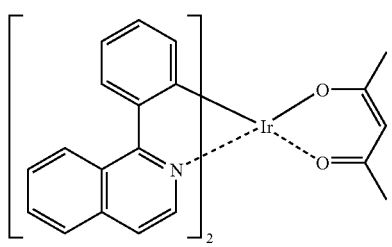
HE-38
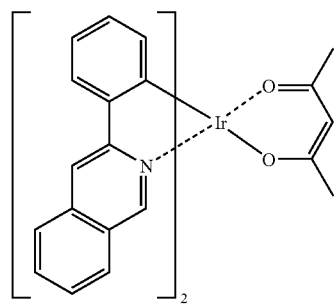
HE-39
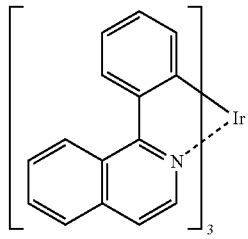
HE-40
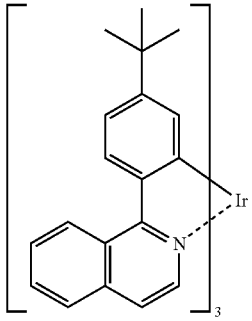
HE-41
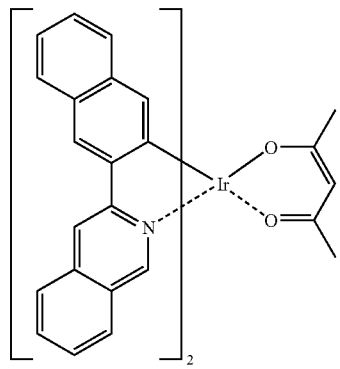
HE-42
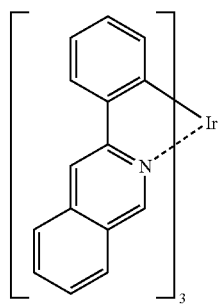
HE-43
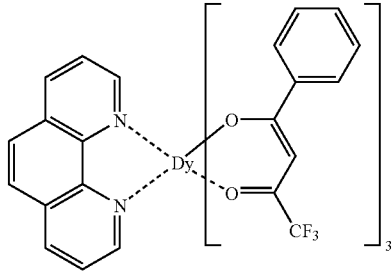

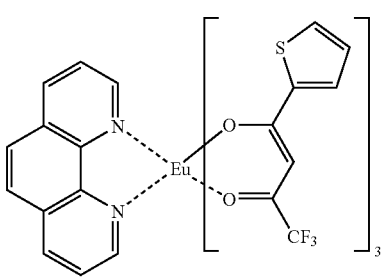

HE-44

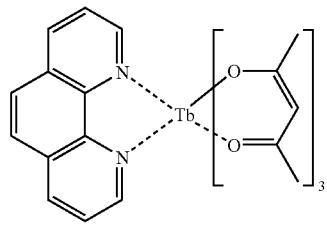

HE-45

(Electron-Transporting Host Material)

As the electron-transporting host material used in the present invention, it is preferred that an electron affinity Ea of the host material is from 2.5 eV to 3.5 eV, more preferably from 2.6 eV to 3.4 eV, and even more preferably from 2.8 eV to 3.3 eV in view of improvements in durability and decrease in driving voltage. Furthermore, it is preferred that an ionization potential Ip of the host is from 5.7 eV to 7.5 eV, more preferably from 5.8 eV to 7.0 eV, and even more preferably from 5.9 eV to 6.5 eV in view of improvements in durability and decrease in driving voltage.

Specific examples of such electron-transporting host material include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyrazine, fluorine-substituted aromatic compounds, aromacyclic tetracarboxylic anhydrides of naphthalene, perylene or the like, phthalocyanine, derivatives thereof (which may form a condensed ring with another ring), and a variety of metal complexes represented by metal complexes of 8-quinolinol derivatives, metal phthalocyanine, and metal complexes having benzoxazole or benzothiazole as the ligand.

Preferable electron-transporting host material are metal complexes, azole derivatives (benzimidazole derivatives, imidazopyridine derivatives and the like), and azine derivatives (pyridine derivatives, pyrimidine derivatives, triazine derivatives and the like). Among these, metal complexe compounds are preferred in the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and even more preferable is an aluminum ion, a zinc ion, a platinum ion or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(Organometallic Chemistry—Fundamental and Application—)" authored by Akio Yamamoto, published by Shokabo Publishing Co., Ltd. in 1982; and the like.

The ligands are preferably nitrogen-containing heterocyclic ligands (having preferably 1 to 30 carbon atoms, more preferably 2 to 20 carbon atoms, and particularly preferably 3 to 15 carbon atoms), and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzoxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, siloxy ligands, aromatic hydrocarbon anion ligands, and aromatic heterocyclic anion ligands are preferable, and nitrogen-containing heterocyclic ligands, aryloxy ligands, siloxy ligands, aromatic hydrocarbon anion ligands, and aromatic heterocyclic anion ligands are more preferable.

Examples of the metal complex electron-transporting host material include compounds described, for example, in JP-A Nos. 2002-235076, 2004-214179, 2004-221062, 2004-221065, 2004-221068, 2004-327313 and the like.
Specific examples of these electron-transporting host materials include the following materials, but it should be noted that the present invention is not limited thereto.
E-1
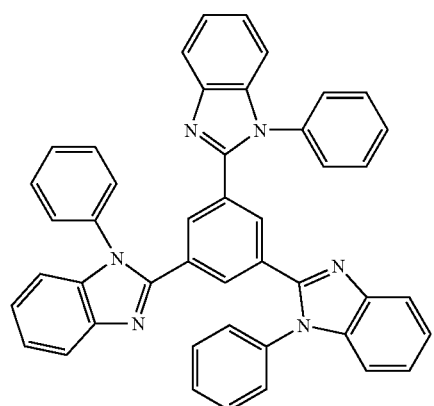
E-2
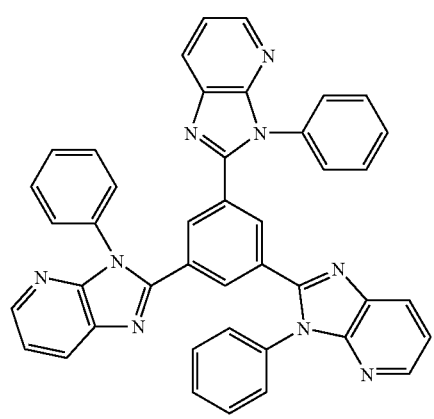
E-3
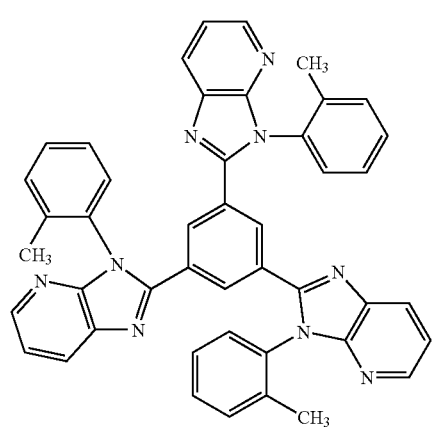
E-4
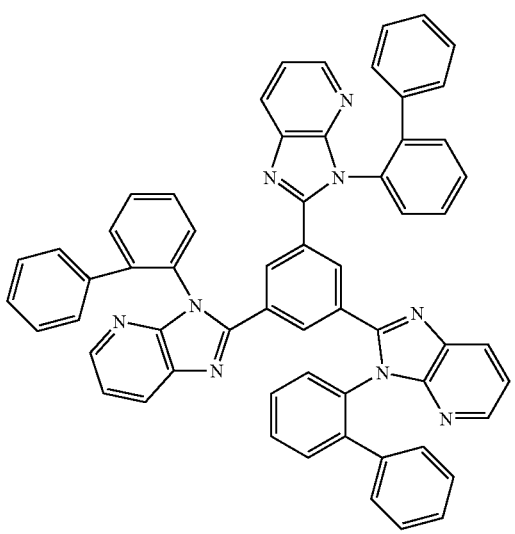
E-5
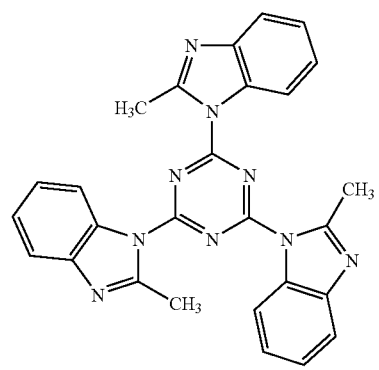
E-6
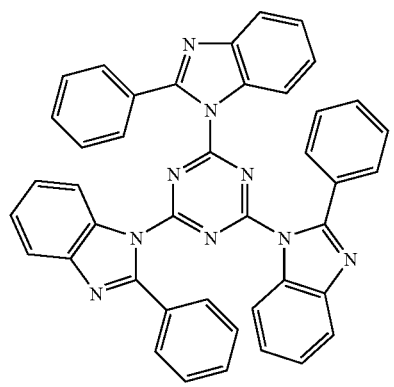
E-7
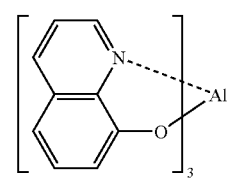

E-8
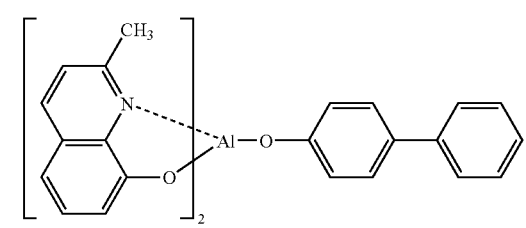
E-9
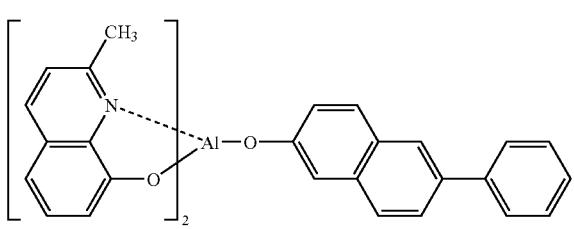
E-10
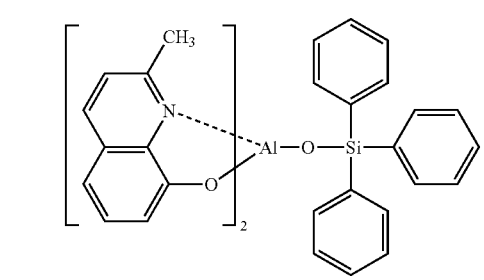
E-11
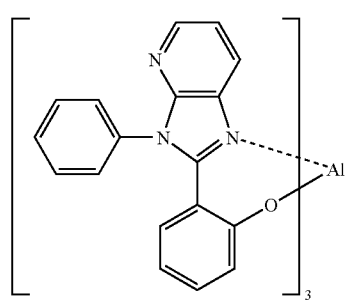
E-12
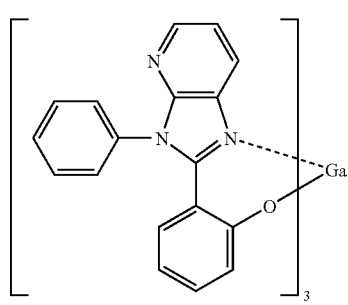
E-13
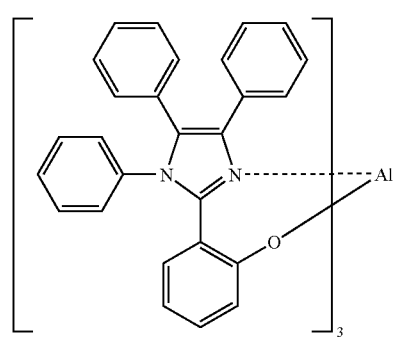
E-14
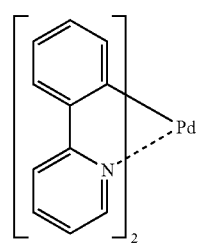
E-15
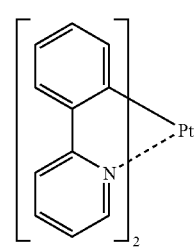
E-16
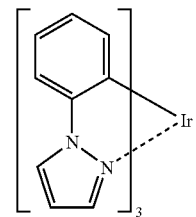
E-17
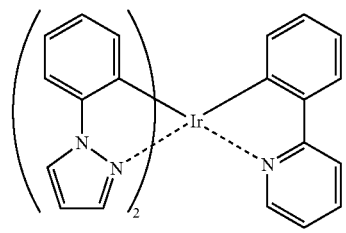
E-18
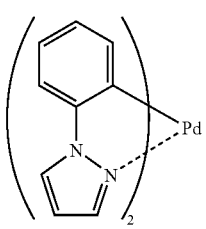

-continued

E-19
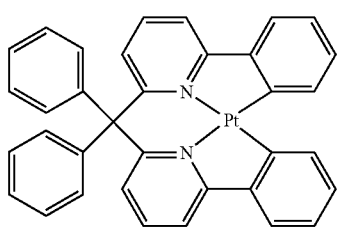

E-20
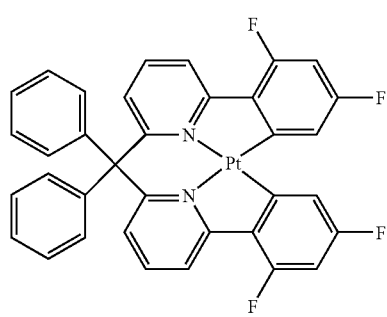

E-21
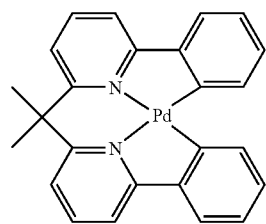

E-22
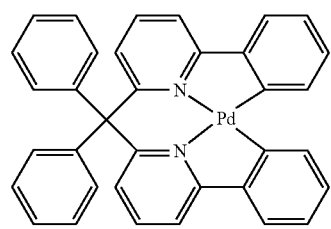

E-23
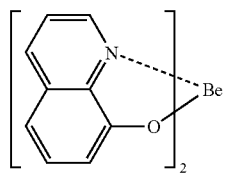

E-24
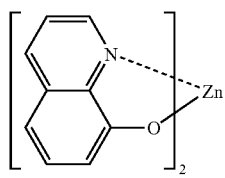

-continued

E-25
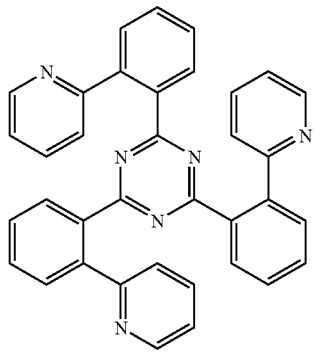

E-26
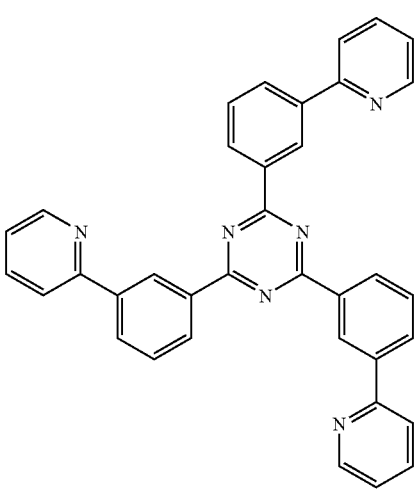

As the electron-transporting host material, E-1 to E-6, E-8, E-9, E-10, E-21, or E-22 is preferred, E-3, E-4, E-6, E-8, E-9, E-10, E-21, or E-22 is more preferred, and E-3, E-4, E-8, E-9, E-21, or E-22 is even more preferred.

(Other Host Materials)

The host material in the present invention can use a hole transporting host material (hereinafter referred to as a "hole transporting host" in some cases) which is excellent in hole transport-ability in a combination with an electron-transporting host material.

The hole transporting host used for the organic layer of the present invention preferably has an ionization potential Ip of from 5.1 eV to 6.4 eV, more preferably from 5.4 eV to 6.2 eV, and even more preferably from 5.6 eV to 6.0 eV in view of improvements in durability and decrease in driving voltage. Furthermore, it preferably has an electron affinity Ea of from 1.2 eV to 3.1 eV, more preferably of from 1.4 eV to 3.0 eV, and even more preferably of from 1.8 eV to 2.8 eV in view of improvements in durability and decrease in driving voltage.

Specific examples of such hole transporting hosts include pyrrole, carbazole, azacarbazole, indole, azaindole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electric conductive high-molecular oligomers such as thiophene oligomers, polythiophenes and the like, organosilanes, carbon films, derivatives thereof, and the like.

Among these, carbazole derivatives, indole derivatives, aromatic tertiary amine compounds, and thiophene derivatives are preferable, and particularly, compounds containing a plurality of carbazole skeletons, indole skeletons and/or aromatic tertiary amine skeletons in the molecule are preferred.

As specific examples of the hole transporting host described above, the following compounds may be listed, but the present invention is not limited thereto.

H-1
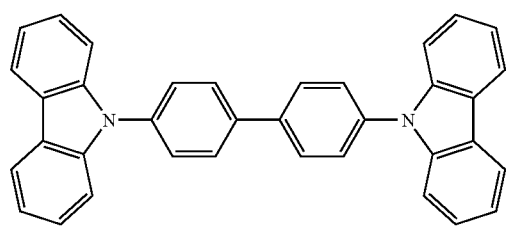

H-2
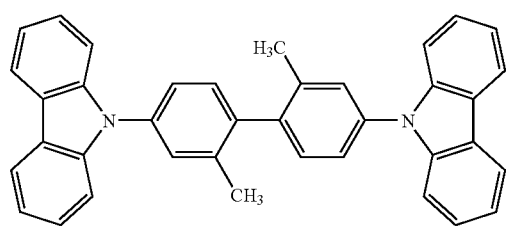

H-3
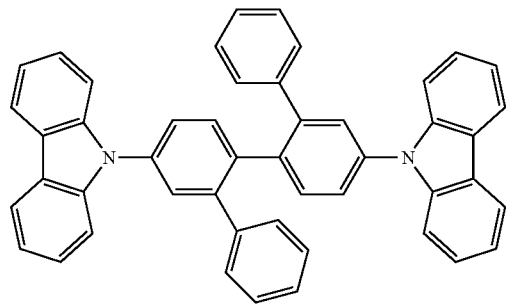

H-4
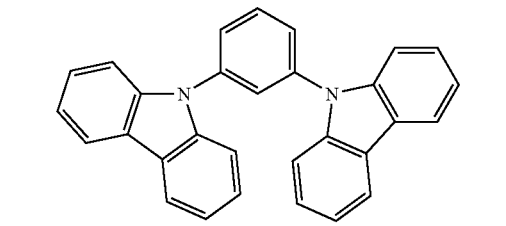

H-5
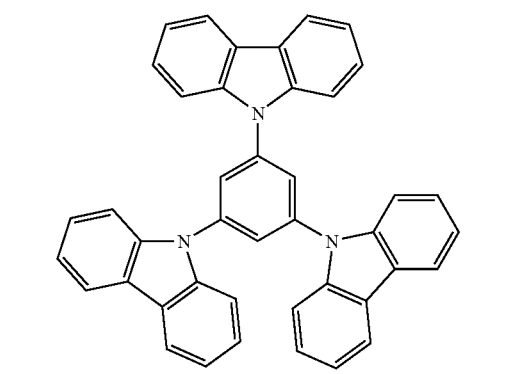

-continued

H-6
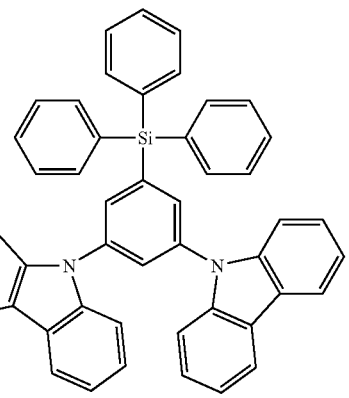

H-7
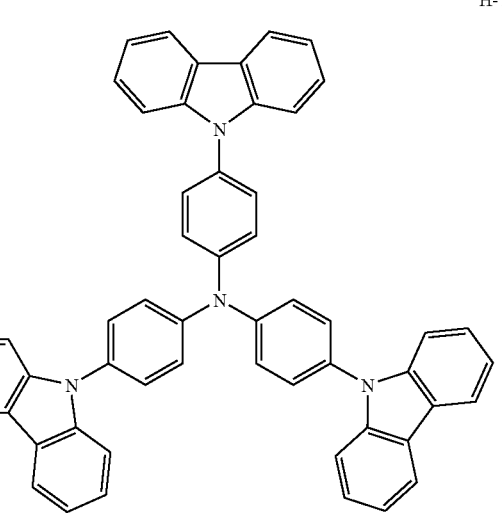

H-8
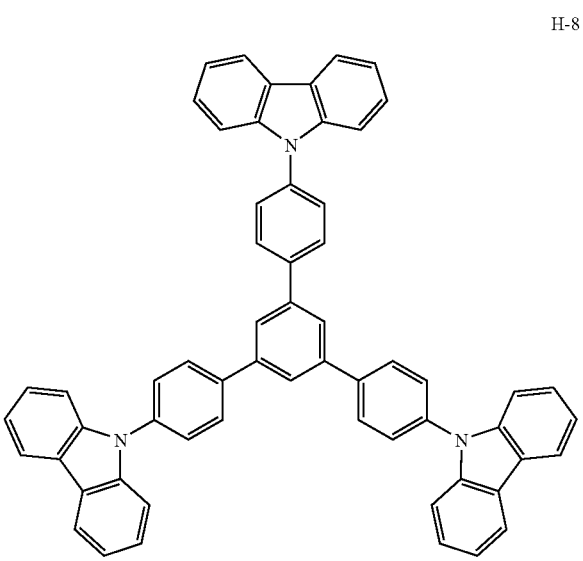

H-9
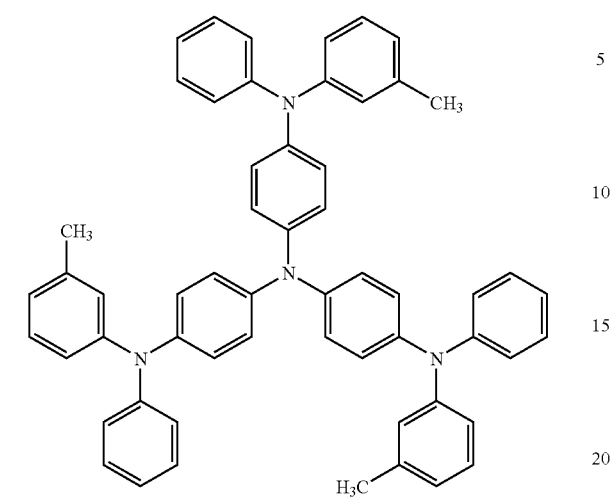
H-10
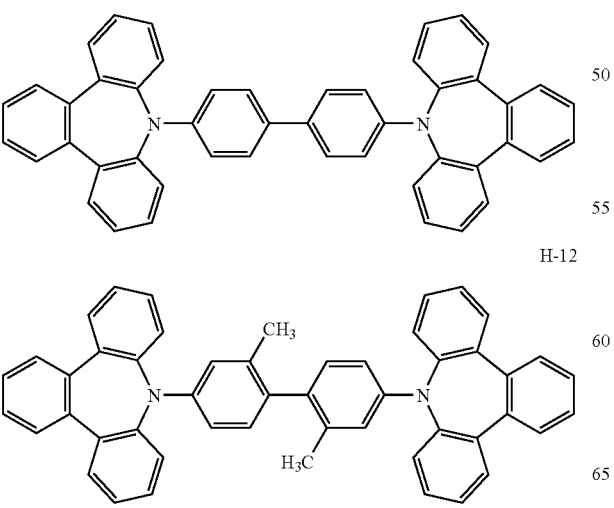
H-11
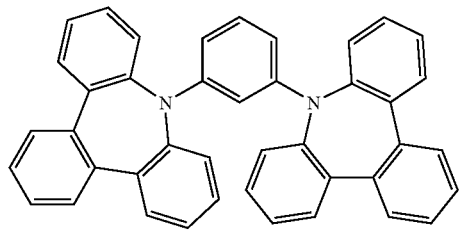
H-12
H-13
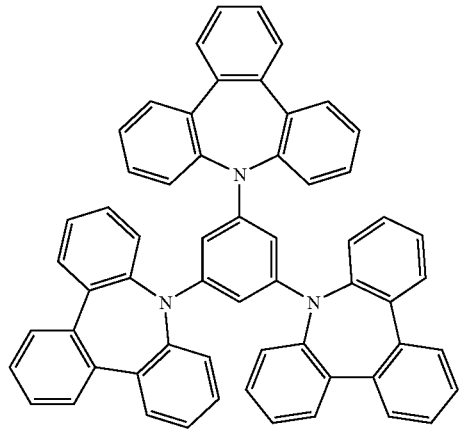
H-14
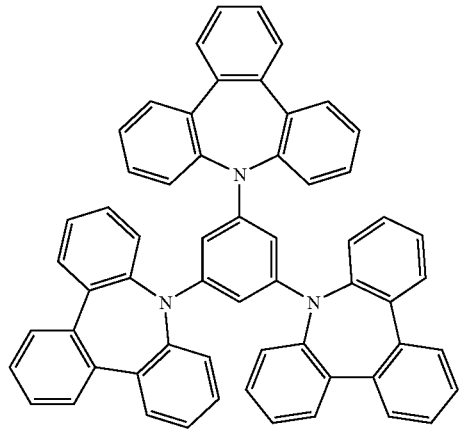
H-15
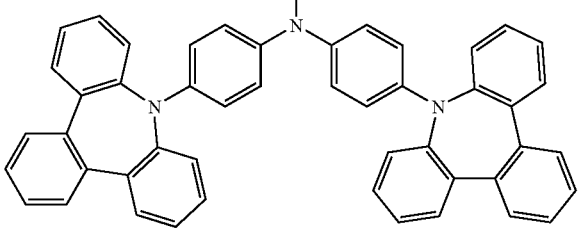

H-16
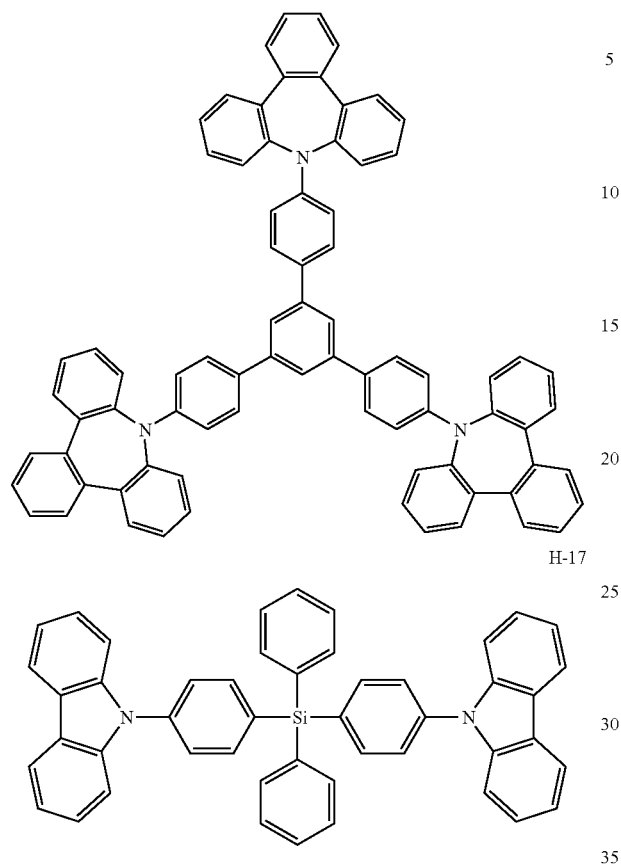
H-20
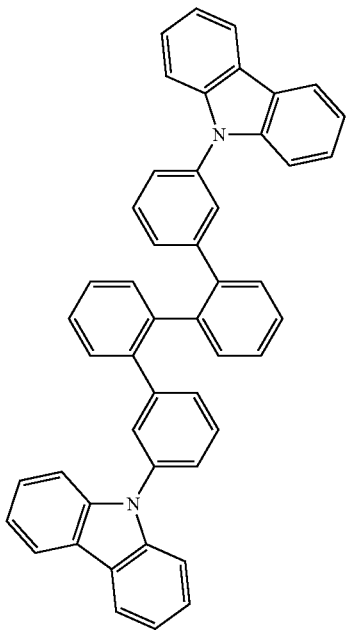
H-17
H-18
H-19
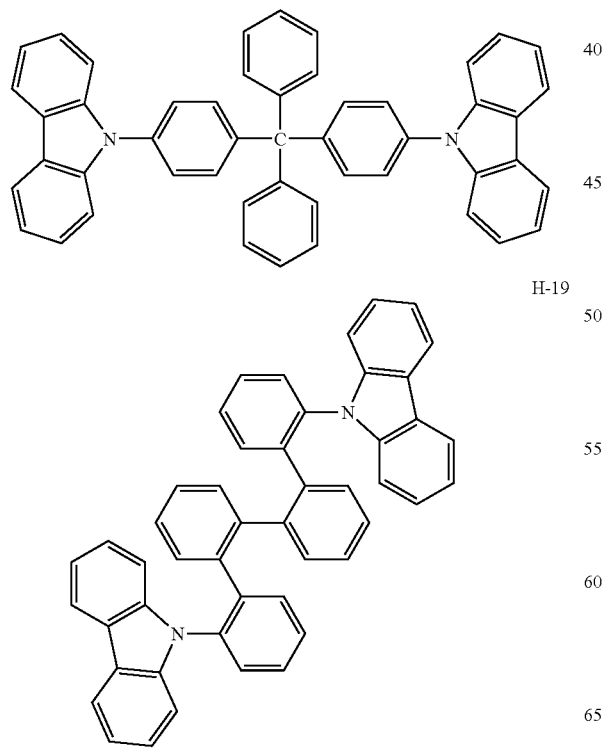
H-21
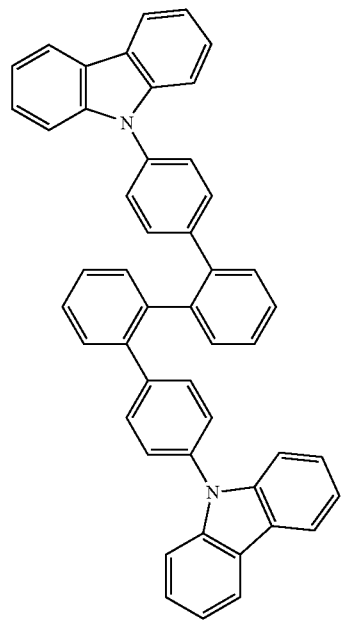

H-22
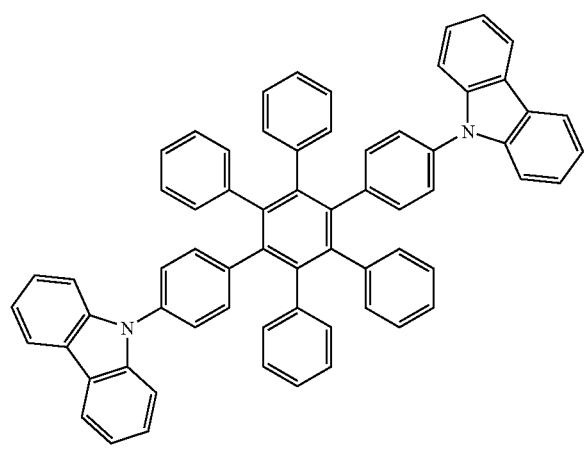

H-23
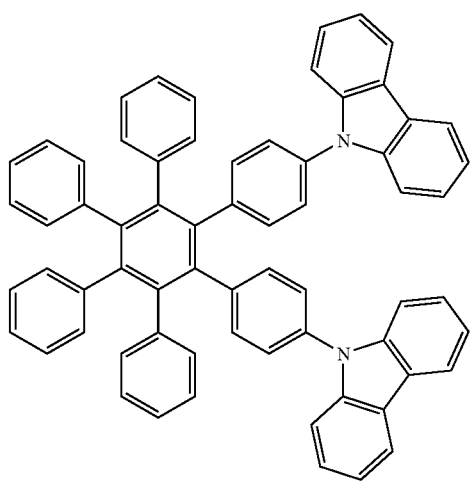

H-24
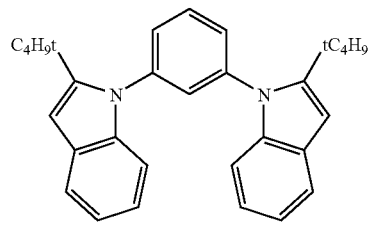

H-25
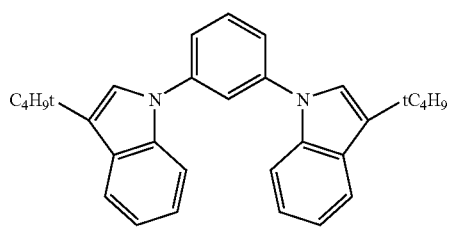

H-26
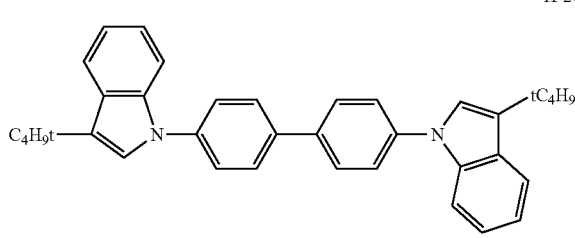

<Film Thickness>

From the viewpoints of unevenness in brightness, driving voltage and brightness, the light-emitting layer preferably has a film thickness of from 0.03 μm to 0.5 μm, and more preferably from 0.06 μm to 0.4 μm. In the case where the film thickness of the light-emitting layer is too thin, though driving at a high brightness and a low voltage is possible, since the device resistance is low, the light-emitting layer is easily affected in the change in brightness to be caused due to drop in voltage, resulting in an increase of unevenness in brightness. In the case where the film thickness of the light-emitting layer is too thick, a driving voltage increases, and a reduction in light-emission efficiency is brought, thereby causing limitations of the application thereof.

<Layer Configuration>

The light-emitting layer may be composed of a single layer or two or more layers, wherein the respective layers may emitt light of different colors from one another. Also, in the case where the light-emitting layer has a laminate structure, though the film thickness of each of the layers configuring the laminate structure is not particularly limited, it is preferable that a total film thickness of each of the light-emitting layers falls within the foregoing range.

3. Hole Injection Layer and Hole Transport Layer

The hole injection layer and hole transport layer correspond to layers functioning to receive holes from an anode or from an anode side and to transport the holes to a cathode side. As a material for the hole injection layer and the hole transport layer, it is preferred to contain specifically carbazole derivatives, azacarbazole derivatives, indole derivatives, azaindole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, organosilane derivatives, carbon, or the like.

An electron-accepting dopant may be introduced into a hole injection layer or a hole transport layer in the organic EL element of the present invention. As the electron-accepting dopant to be introduced into a hole injection layer or a hole transport layer, either of an inorganic compound or an organic compound may be used as long as the compound has electron accepting property and a property for oxidizing an organic compound.

Specifically, the inorganic compound includes metal halides such as iron (II) chloride, aluminum chloride, gallium chloride, indium chloride, antimony pentachloride and the like, and metal oxides such as vanadium pentaoxide, molybdenum trioxide and the like.

In the case of employing the organic compounds, compounds having a substituent such as a nitro group, a halogen, a cyano group, a trifluoromethyl group or the like; quinone compounds; acid anhydride compounds; fullerenes; and the like may be preferably applied.

Specific examples thereof other than those above include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is more preferable, and tetrafluorotetracyanoquinodimethane is particularly preferred.

These electron-accepting dopants may be used alone or in a combination of two or more of them. Although an applied amount of these electron-accepting dopants depends on the type of material, 0.01% by weight to 50% by weight is preferred with respect to a hole transport layer material, 0.05% by weight to 20% by weight is more preferable, and 0.1% by weight to 10% by weight is particularly preferred.

A thickness of the hole injection layer and a thickness of the hole transport layer are each preferably 500 nm or less, in view of decrease in driving voltage.

The thickness of the hole transport layer is preferably from 1 nm to 200 nm, more preferably from 5 nm to 100 nm, and even more preferably from 10 nm to 60 nm. The thickness of the hole injection layer is preferably from 0.1 nm to 500 nm, more preferably from 0.5 nm to 300 nm, and even more preferably from 1 nm to 200 nm.

The hole injection layer and the hole transport layer may be composed of a monolayer structure comprising one or two or more of the above-mentioned materials, or a multilayer structure composed of plural layers of a homogeneous composition or a heterogeneous composition.

4. Electron Injection Layer and Electron Transport Layer

The electron injection layer and the electron transport layer are layers having functions for receiving electrons from a cathode or from a cathode side and transporting electrons to an anode side. Specific examples of the materials applied for the electron injection layer and the electron transport layer include triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromacyclic tetracarboxylic anhydrides of perylene, naphthalene or the like, phthalocyanine derivatives, metal complexes represented by metal complexes of 8-quinolinol derivatives, metal phthalocyanine, and metal complexes containing benzoxazole, or benzothiazole as the ligand, organosilane derivatives, and the like.

The electron injection layer or the electron transport layer in the organic EL element of the invention may contain an electron donating dopant. As the electron donating dopant introduced in the electron injection layer or the electron transport layer, any material may be used as long as it has an electron-donating property and a property for reducing an organic compound, and alkaline metals such as Li, alkaline earth metals such as Mg, transition metals including rare-earth metals, and reducing organic compounds are preferably used. As the metals, particularly, metals having a work function of 4.2 V or less are preferably applied, and specific examples thereof include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds, and the like.

In addition, materials described in JP-A Nos. 6-212153, 2000-196140, 2003-68468, 2003-229278 and 2004-342614 and the like may be used.

These electron donating dopants may be used alone or in a combination of two or more of them. An applied amount of the electron donating dopants differs dependent on the types of the materials, but it is preferably from 0.1% by weight to 99% by weight with respect to an electron transport layer material, more preferably from 1.0% by weight to 80% by weight, and particularly preferably from 2.0% by weight to 70% by weight.

A thickness of the electron injection layer and a thickness of the electron transport layer are each preferably 500 nm or less in view of decrease in driving voltage.

The thickness of the electron transport layer is preferably from 5 nm to 200 nm, and more preferably from 10 nm to 50 nm. The thickness of the electron injection layer is preferably from 0.1 nm to 50 nm, and more preferably from 0.5 nm to 20 nm.

The electron injection layer and the electron-transport may be composed of a monolayer structure comprising one or two or more of the above-mentioned materials, or a multilayer structure composed of plural layers of a homogeneous composition or a heterogeneous composition.

In the case where the electron transport layer is an adjacent layer to the light-emitting layer, the material applied therein has preferably an ionization potential of 6.0 eV or less in view of improvements in durability.

5. Substrate

The substrate to be applied in the invention is preferably one which does not scatter or attenuate light emitted from the organic compound layer. Specific examples of materials for the substrate include inorganic materials such as zirconia-stabilized yttrium (YSZ), glass and the like; polyesters such as polyethylene terephthalate, polybutylene phthalate, and polyethylene naphthalate; and organic materials such as polystyrene, polycarbonate, polyethersulfone, polyarylate, polyimide, polycycloolefin, norbornene resin, polychlorotrifluoroethylene, and the like.

For instance, when glass is used as the substrate, non-alkali glass is preferably used with respect to the quality of material in order to decrease ions eluted from the glass. In the case of employing soda-lime glass, it is preferred to use glass on which a barrier coat of silica or the like has been applied. In the case of employing an organic material, it is preferred to use a material excellent in heat resistance, dimensional stability, solvent resistance, electric insulation performance, and workability.

There is no particular limitation as to the shape, the structure, the size or the like of the substrate, but it may be suitably selected according to the application, purposes and the like of the light-emitting element. In general, a plate-like substrate is preferred as the shape of the substrate. A structure of the substrate may be a monolayer structure or a laminate structure. Furthermore, the substrate may be formed from a single member or two or more members.

Although the substrate may be transparent and colorless, or transparent and colored, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

6. Electrode (Anode)

The anode may generally be any material as long as it has a function as an electrode for supplying holes to the organic compound layer, and there is no particular limitation as to the shape, the structure, the size or the like. It may be suitably selected from among well-known electrode materials according to the application and purpose of the light-emitting element. As mentioned above, the anode is usually provided as a transparent anode.

Materials for the anode preferably include, for example, metals, alloys, metal oxides, electric conductive compounds, and mixtures thereof. Materials having a work function of 4.0 eV or more are preferable. Specific examples of the anode materials include electric conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide and copper sulfide; organic electric conductive materials such as polyaniline, polythiophene, and polypyrrole; and laminates of these inorganic or organic electric conductive materials with ITO. Among these, the electric conductive metal oxides are preferred, and particularly, ITO is preferable in view of productivity, high electric conductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD (chemical vapor deposition) and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element of the present invention, a position at which the anode is to be formed is not particularly limited, but it may be suitably selected according to the application and purpose of the light-emitting element. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in a range of from 10 nm to 50 µm, and preferably from 50 nm to 20 µm.

A value of electric resistance of the anode is preferably $10^3 \Omega/\square$ or less, and more preferably $10^2 \Omega/\square$ or less. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTEN-KAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the light-emitting element.

Materials constituting the cathode include, for example, metals, alloys, metal oxides, electric conductive compounds, and mixtures thereof. Materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron inject-ability.

Among these, as the materials for constituting the cathode, alkaline metals or alkaline earth metals are preferred in view of electron inject-ability, and materials containing aluminum as a major component are preferred in view of excellent preservation stability.

The term "material containing aluminum as a major component" refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, the contents of which are incorporated by reference herein.

A method for forming the cathode is not particularly limited, but it may be formed in accordance with a well-known method. For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted between the cathode and the organic compound layer with a thickness of from 0.1 nm to 5 nm. The dielectric layer may be considered to be a kind of electron injection layer. The dielectric material layer may be formed in accordance with, for example, a vacuum deposition method, a sputtering method, an ion plating method or the like.

A thickness of the cathode may be suitably selected according to materials for constituting the cathode and is therefore not definitely decided, but it is usually in a range of from 10 nm to 5 μm, and preferably from 50 nm to 1 μm.

Moreover, the cathode may be transparent or opaque. The transparent cathode may be formed by preparing a material for the cathode with a small thickness of from 1 nm to 10 nm, and further laminating a transparent electric conductive material such as ITO or IZO thereon.

7. Protective Layer

A whole body of the organic EL element of the present invention may be protected by a protective layer. Any materials may be applied in the protective layer as long as the materials have a function to protect a penetration of ingredients such as moisture, oxygen or the like which accelerates deterioration of the element into the element.

Specific examples of materials for the protective layer include metals such as In, Sn, Pb, Au, Cu, Ag, Al, Ti, Ni, and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$, and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

8. Sealing

The whole organic electroluminescence element of the present invention may be sealed with a sealing cap.

Furthermore, a moisture absorbent or an inert liquid may be used to seal a space defined between the sealing cap and the light-emitting element. Although the moisture absorbent is not particularly limited, specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

9. Driving

In the organic electroluminescence element of the present invention, when a DC (AC components may be contained as needed) voltage (usually 2 volts to 15 volts) or DC is applied across the anode and the cathode, luminescence can be obtained.

For the driving method of the organic electroluminescence element of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

10. Applications

An organic EL element according to the invention has such wide ranging applications as a mobile phone display, a personal digital assistant (PDA), a computer display, a car information display, a TV monitor, and general illumination.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the organic EL element of the present invention will be explained by examples thereof, but the invention is by no means limited by such examples.

Example 1

1. Preparation of Organic EL Element (Preparation of Comparative Organic EL Element No. 1)

A glass substrate (manufactured by Geomatee Co., Ltd., surface electric resistance: 10Ω/□, size: 0.5 mm in thickness and 2.5 cm square) having a deposited layer of indium-tin oxide (which is referred to hereinafter as ITO) at a thickness of 100 nm was placed in a cleaning vessel, subjected to an ultrasonic cleaning in 2-propanol and then subjected to an UV-ozone treatment for 30 minutes. On this transparent anode, the following layers were deposited in accordance with a vacuum deposition method. In the examples of the invention, the deposition rate is 0.2 nm/sec unless specified otherwise. The deposition rate was measured using a quartz-crystal oscillator. Also film thicknesses described in the following were measured using a quartz-crystal oscillator.

Hole injection layer: 4,4',4''-tris[2-naphthyl(phenyl)amino]triphenylamine (which is referred to hereinafter as 2-TNATA) and tetrafluorotetracyanoquinodimethane (which is referred to hereinafter as F4-TCNQ) were co-deposited so that F4-TCNQ was included in an amount of 1.0% by weight with respect to 2-TNATA. The thickness was 160 nm.

Hole transport layer: N,N'-di(1-naphthyl)-N,N'-diphenyl-1,1'-biphenyl-4,4'-diamine (which is referred to hereinafter as α-NPD), at a thickness of 10 nm.

Light-emitting layer: 4,4'-di-(N-carbazole)-biphenyl (which is referred to hereinafter as CBP) as a hole-transporting host material and EA-1 as a hole-transporting phosphorescent light-emitting material were co-deposited so that EA-1 was included in an amount of 10% by weight with respect to CBP. The thickness was 60 nm.

Subsequently, on the light-emitting layer, the following electron transport layer and electron injection layer were provided.

Electron transport layer: aluminum (III) bis(2-methyl-8-quinolinato) 4-phenylphenolate (which is referred to hereinafter as BAlq), at a thickness of 40 nm.

Electron injection layer: lithium fluoride (LiF), at a thickness of 1 nm.

Further, patterning was performed using a shadow mask, and aluminum metal (Al) with a thickness of 100 nm was provided as a cathode.

Each layer was provided by resistance heating vacuum deposition.

The lamination body thus produced was placed in a glove box substituted with nitrogen gas, and was sealed using a stainless-steel sealing cap and an ultraviolet-curable adhesive (XNR5516HV, manufactured by Nagase-Ciba Co., Ltd.).

(Preparation of Comparative Organic EL Element No. 2)

Preparation of comparative organic EL element No. 2 was conducted in a similar manner to the process in the preparation of the comparative organic EL element No. 1, except that, in the comparative organic EL element No. 1, the following hole-blocking layer was disposed between the light-emitting layer and the electron transport layer.

Hole-blocking layer: 2,9-dimethyl-4,7-diphenyl-1,10-phenanthroline (which is hereinafter referred to as BCP), at a thickness of 5 nm.

(Preparation of Comparative Organic EL Element No. 3)

In the comparative organic EL element No. 1, the light-emitting layer was changed to the layer described below.

The co-deposition amount of the hole-transporting host material CBP and the hole-transporting phosphorescent light-emitting material EA-1 was continuously changed as the deposition was progressing. The deposition rate of each component was controlled so that the mixing ratio was CBP:EA-1=80% by weight:20% by weight at the interface on the anode side at the beginning of the deposition; and the mixing ratio was CBP:EA-1=100% by weight:0% by weight at the interface on the cathode side at the end of the deposition. The mixing ratio of each component was continuously changed between these interfaces. The total thickness of the light-emitting layer was 60 nm. The concentration of each material was as follows: CBP of 81% by weight, and EA-1 of 19% by weight in an interface region on the anode side; and CBP of 99% by weight, and EA-1 of 1% by weight in an interface region on the cathode side.

(Preparation of Comparative Organic EL Element No. 4)

Preparation of comparative organic EL element No. 4 was conducted in a similar manner to the process in the preparation of the comparative organic EL element No. 1, except that, in the comparative organic EL element No. 1, the following layer was disposed as the light-emitting layer.

Light-emitting layer: the electron-transporting host material BAlq and the hole-transporting phosphorescent light-emitting material EA-1 were co-deposited so that EA-1 was included in an amount of 10% by weight with respect to BAlq. The thickness of the light-emitting layer was 60 nm.

(Preparation of Comparative Organic EL Element No. 5)

Preparation of comparative organic EL element No. 5 was conducted in a similar manner to the process in the preparation of the comparative organic EL element No. 1, except that, in the comparative organic EL element No. 1, the following layer was disposed as the light-emitting layer.

Light-emitting layer: the electron-transporting host material BAlq and the hole-transporting phosphorescent light-emitting material EA-1 were co-deposited so that EA-1 was included in an amount of 5% by weight with respect to BAlq. The thickness of the light-emitting layer was 60 nm.

(Preparation of Comparative Organic EL Element No. 6)

Preparation of comparative organic EL element No. 6 was conducted in a similar manner to the process in the preparation of the comparative organic EL element No. 1, except that, in the comparative organic EL element No. 1, the following layer was disposed as the light-emitting layer.

Light-emitting layer: the electron-transporting host material BAlq and the hole-transporting phosphorescent light-emitting material EA-1 were co-deposited so that EA-1 was included in an amount of 20% by weight with respect to BAlq. The thickness of the light-emitting layer was 60 nm.

(Preparation of Inventive Organic EL Element No. 1)

In the comparative organic EL element No. 1, the light-emitting layer was changed to the layer described below.

Light-emitting layer: the co-deposition amount of the electron-transporting host material BAlq and the hole-transporting phosphorescent light-emitting material EA-1 was changed as the deposition was progressing. The deposition rate of each component was controlled so that the mixing ratio was BAlq:EA-1=80% by weight:20% by weight at the interface on the anode side at the beginning of the deposition; and the mixing ratio was BAlq:EA-1=95% by weight: 5% by weight at the interface on the cathode side at the end of the deposition. The mixing ratio of each component was continuously changed between these interfaces. The total thickness of the light-emitting layer was 60 nm. The concentration of each material was as follows: BAlq of 80.75% by weight, and EA-1 of 19.25% by weight in an interface region on the anode side; and BAlq of 94.25% by weight, and EA-1 of 5.75% by weight in an interface region on the cathode side.

(Preparation of Inventive Organic EL Element No. 2)

In the comparative organic EL element No. 1, the light-emitting layer was changed to the layer described below.

Light-emitting layer: the co-deposition amount of the electron-transporting host material BAlq and the hole-transporting phosphorescent light-emitting material EA-1 was changed as the deposition was progressing. The deposition rate of each component was controlled so that the mixing ratio was BAlq:EA-1=80% by weight:20% by weight at the interface on the anode side at the beginning of the deposition; and the mixing ratio was BAlq:EA-1=100% by weight:0% by weight at the interface on the cathode side at the end of the deposition. The mixing ratio of each component was continuously changed between these interfaces. The total thickness of the light-emitting layer was 60 nm. The concentration of each material was as follows: BAlq of 81% by weight, and EA-1 of 19% by weight in an interface region on the anode side; and BAlq of 99% by weight, and EA-1 of 1% by weight in an interface region on the cathode side.

(Preparation of Inventive Organic EL Element No. 3)

In the comparative organic EL element No. 1, the light-emitting layer was changed to the layer described below.

Light-emitting layer: the co-deposition amount of the electron-transporting host material BAlq and the hole-transporting phosphorescent light-emitting material EA-1 was changed as the deposition was progressing. The deposition rate of each component was controlled so that the mixing ratio was BAlq:EA-1=40% by weight:60% by weight at the interface on the anode side at the beginning of the deposition; and the mixing ratio was BAlq:EA-1=100% by weight:0% by weight at the interface on the cathode side at the end of the deposition. The mixing ratio of each component was continuously changed between these interfaces. The total thickness of the light-emitting layer was 60 nm. The concentration of each material was as follows: BAlq of 43% by weight, and EA-1 of 57% by weight in an interface region on the anode side; and BAlq of 97% by weight, and EA-1 of 3% by weight in an interface region on the cathode side.

(Preparation of Inventive Organic EL Element No. 4)

In the comparative organic EL element No. 1, the light-emitting layer was changed to the layer described below.

Light-emitting layer: the co-deposition amount of the electron-transporting host material BAlq and the hole-transporting phosphorescent light-emitting material EA-1 was changed as the deposition was progressing. The deposition rate of each component was controlled so that the mixing ratio was BAlq:EA-1=0% by weight:100% by weight at the interface on the anode side at the beginning of the deposition; and the mixing ratio was BAlq:EA-1=100% by weight:0% by weight at the interface on the cathode side at the end of the deposition. The mixing ratio of each component was continuously changed between these interfaces. The total thickness of the light-emitting layer was 60 nm. The concentration of each material was as follows: BAlq of 5% by weight, and EA-1 of 95% by weight in an interface region on the anode side; and BAlq of 95% by weight, and EA-1 of 5% by weight in an interface region on the cathode side.

Chemical structures of the compounds used in Examples are shown below.

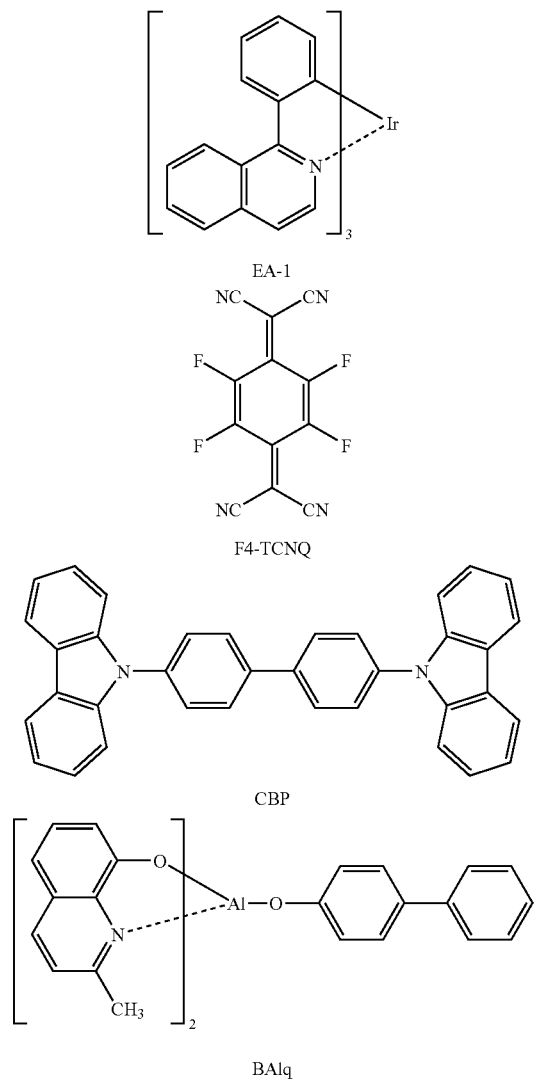

EA-1

F4-TCNQ

CBP

BAlq

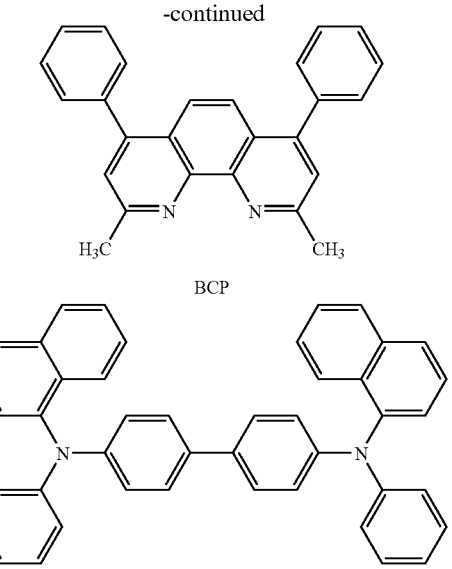

BCP

α-NPD

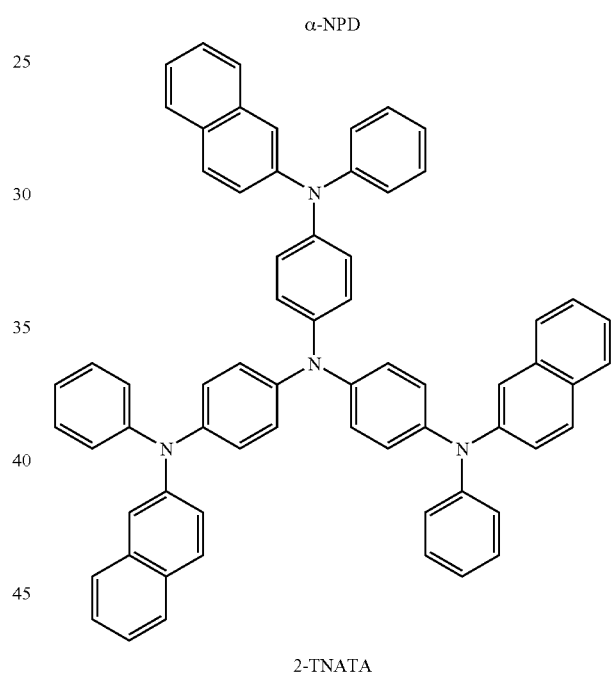

2-TNATA

2. Results of Performance Evaluation

The external quantum efficiency and drive durability of the obtained comparative organic EL elements and inventive organic EL elements were measured by the following means under the same conditions.

<<Driving Voltage>>

The driving voltage is expressed in terms of DC voltage at the brightness of 300 cd/m$^2$.

<<Method of Measuring External Quantum Efficiency>>

DC voltage was applied to the prepared light-emitting elements with a source measuring unit, model 2400, manufactured by KEITHLEY to emit light having a brightness of 300 cd/m$^2$. The emission spectrum and light quantity thereof were measured with a brightness photometer (trade name: SR-3, manufactured by Topcon Corporation), and the external quantum efficiency was calculated from the emission spectrum, the light quantity, and the electric current at the time of measurement.

Further, as an evaluation of light-emission efficiency in high-brightness luminescence, DC voltage was applied to the light-emitting element to emit light having a brightness of 1000 cd/m², and the external quantum efficiency at this brightness was measured.

<<Method of Measuring Drive Durability>>

Each element was subjected to continuous driving under an initial brightness of 300 cd/m² and 1000 cd/m², and a time until the brightness was reduced to a half was measured. Drive durability is expressed in terms of the brightness half-value time.

The obtained results are shown in Table 1. All of the inventive and comparative samples exhibit a red-light emission. All of the inventive organic EL element Nos. 1 to 4 exhibit unexpectedly high external quantum efficiency and excellent drive durability, as compared with the comparative organic EL elements. Concerning the comparative elements, the external quantum efficiency in high-brightness luminescence decreases in an amount larger than the value in low-brightness luminescence; whereas, concerning the inventive elements, the degree of decrease in external quantum efficiency is small even in high-brightness luminescence, so that the light-emission efficiency at high brightness is excellent.

Among the inventive elements, both the external quantum efficiency and the drive durability are improved in order of the inventive organic EL element No. 1, No. 2, No. 3, and No. 4. Therefore, it is revealed that the greater the gradation in the concentration of the hole-transporting light-emitting material and electron-transporting host material in the light-emitting layer is, the greater the effects are.

comparative element No. 3, EA-1 was changed to the hole-transporting phosphorescent light-emitting material Ir(ppy)₃.

Inventive Organic EL Element No. 5: the light-emitting layer thereof was prepared similar to the light-emitting layer of the inventive element No. 2 of Example 1, except that, in the inventive element No. 2, EA-1 was changed to Ir(ppy)₃, and BAlq was changed to E-3.

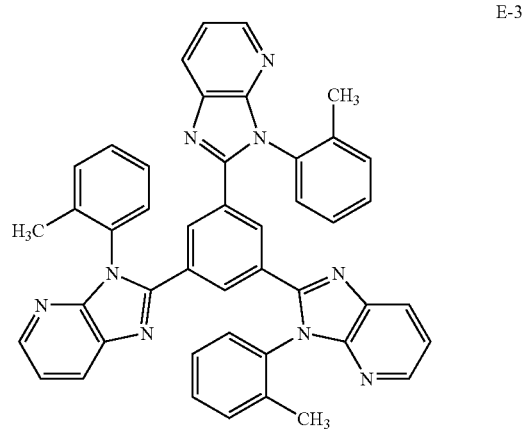

E-3

TABLE 1

| Element No. | Driving Voltage (V) | External Quantum Efficiency (%) (at Initial Brightness of 300 cd/m²) | Brightness Half-value Time (hr) (at Initial Brightness of 300 cd/m²) | External Quantum Efficiency (%) (at Initial Brightness of 1,000 cd/m²) | Brightness Half-value Time (hr) (at Initial Brightness of 1,000 cd/m²) |
|---|---|---|---|---|---|
| Comparative Element No. 1 | 9.0 | 6.0 | 1250 | 4.0 | 270 |
| Comparative Element No. 2 | 9.1 | 9.0 | 750 | 4.0 | 120 |
| Comparative Element No. 3 | 10.0 | 5.0 | 880 | 3.0 | 210 |
| Comparative Element No. 4 | 12.2 | 8.0 | 520 | 5.0 | 740 |
| Comparative Element No. 5 | 12.9 | 7.0 | 4500 | 4.0 | 530 |
| Comparative Element No. 6 | 11.7 | 7.0 | 5300 | 4.0 | 570 |
| Inventive Element No. 1 | 8.5 | 10.0 | 18000 | 9.0 | 4000 |
| Inventive Element No. 2 | 7.8 | 11.0 | 21000 | 10.0 | 4300 |
| Inventive Element No. 3 | 7.0 | 12.0 | 28000 | 11.0 | 4700 |
| Inventive Element No. 4 | 6.0 | 12.0 | 31000 | 11.0 | 5300 |

Example 2

Elements were prepared in a similar manner to that in Example 1, except that, in Example 1, the light-emitting layer was changed to the layer described below.

Comparative Element No. 7: the light-emitting layer thereof was prepared in a similar manner to that in the light-emitting layer of the comparative element No. 1 of Example 1, except that, in the comparative element No. 1, EA-1 was changed to another hole-transporting phosphorescent light-emitting material, iridium (III) fac-tris(2-phenylpyridinato-N, C²') (which is hereinafter referred to as Ir(ppy)₃).

Comparative Element No. 8: the light-emitting layer thereof was prepared similar to the light-emitting layer of the comparative element No. 4 of Example 1, except that, in the comparative element No. 4, EA-1 was changed to Ir(ppy)₃ and BAlq was changed to E-3.

Comparative Element No. 9: the light-emitting layer thereof was prepared similar to the light-emitting layer of the comparative element No. 3 of Example 1, except that, in the -continued

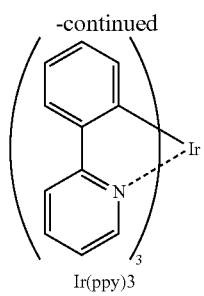

Ir(ppy)3

The obtained samples were evaluated in a similar manner to that in Example 1. Results are shown in Table 2.

The comparative element Nos. 8 and 9, and the inventive element No. 5 in the Example exhibit a green-light emission.

The inventive organic EL element No. 5 exhibits unexpectedly high external quantum efficiency and excellent drive durability, as compared with the comparative organic EL element Nos. 8 and 9. In particular, concerning the comparative elements, the external quantum efficiency in high-brightness luminescence decreases in a large amount; whereas, in the inventive element, the degree of decrease in external quantum efficiency is extremely small even in high-brightness luminescence, so that the light-emission efficiency at high brightness is excellent.

TABLE 2

| Element No. | Driving Voltage (V) | External Quantum Efficiency (%) (at Initial Brightness of 300 cd/m²) | External Quantum Efficiency (%) (at Initial Brightness of 1,000 cd/m²) |
|---|---|---|---|
| Comparative Element No. 7 | 7 | 8.0 | 5.0 |
| Comparative Element No. 8 | 7 | 10.0 | 6.0 |
| Comparative Element No. 9 | 8 | 7.0 | 4.0 |
| Inventive Element No. 5 | 6 | 14.0 | 13.0 |

Example 3

An element was prepared in a similar manner to that in Example 2, except that, in Example 2, the light-emitting layer was changed to the layer described below.

Inventive Organic EL Element No. 6: the light-emitting layer thereof was prepared in a similar manner to that in the light-emitting layer of the inventive element No. 5, except that, in the inventive element No. 5, a hole-transporting phosphorescent light-emitting material of Ir complex A was used instead of Ir(ppy)₃, and electron-transporting host material E-5 was used instead of E-3.

The obtained sample was evaluated in a similar manner to that in Example 1.

The inventive element No. 6 provides a blue-light emission and exhibits unexpectedly high external quantum efficiency and excellent drive durability, similar to that in Example 2.

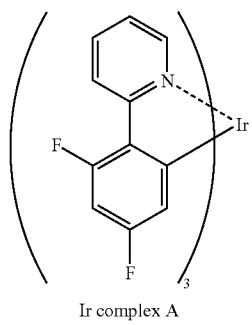

Ir complex A

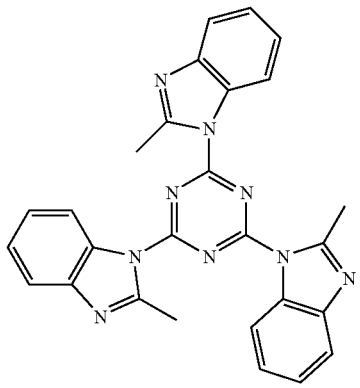

E-5

Example 4

An element was prepared in a similar manner to that in Example 3, except that, in Example 3, the light-emitting layer was changed to the layer described below.

Inventive Organic EL Element No. 7: the light-emitting layer thereof was prepared in a similar manner to that in the light-emitting layer of the inventive element No. 6, except that a hole-transporting phosphorescent light-emitting material of Ir complex B was used instead of the Ir complex A in the inventive element No. 6.

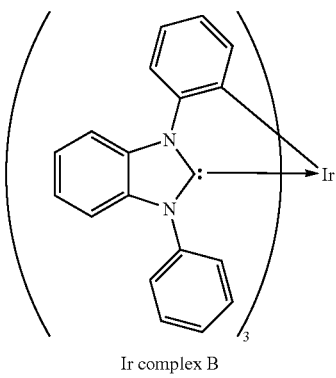

Ir complex B

The obtained sample was evaluated in a similar manner to that in Example 1.

The inventive element No. 7 provides a blue-light emission and exhibits unexpectedly high external quantum efficiency and excellent drive durability, similar to that in Example 3.

Example 5

An element was prepared in a similar manner to that in Example 1, except that, in Example 1, the light-emitting layer was changed to the layer described below.

Inventive Organic EL Element No. 8: the light-emitting layer thereof was prepared in a similar manner to that in the light-emitting layer of the inventive element No. 2, except that a hole-transporting fluorescent light-emitting material F-1 was used instead of the hole-transporting phosphorescent light-emitting material EA-1 in the inventive element No. 2.

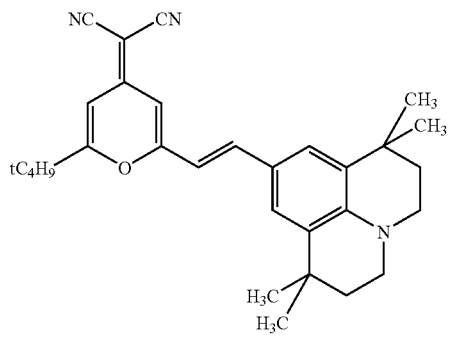

F-1

The obtained sample was evaluated in a similar manner to that in Example 1.

The inventive element No. 8 provides a red-light emission and exhibits unexpectedly high external quantum efficiency and excellent drive durability, similar to that in Example 1.

What is claimed is:

1. An organic electroluminescence element comprising an organic layer comprising a light-emitting layer disposed between a pair of electrodes, wherein the light-emitting layer comprises at least one hole-transporting light-emitting material and at least one electron-transporting host material, and a concentration of the hole-transporting light-emitting material in the light-emitting layer decreases from an anode side toward a cathode side;
   wherein the at least one hole-transporting light-emitting material and the at least one electron-transporting host material are simultaneously present at the entire light-emitting layer, and a concentration of the at least one hole-transporting light-emitting material decreases from an anode side toward a cathode side within the entire light-emitting layer at which the at least one hole-transporting light-emitting material and the at least one electron-transporting host material are simultaneously present; and
   wherein a ratio of the concentration of the hole-transporting light-emitting material in an interface region of the entire light-emitting layer on the cathode side relative to the concentration of the hole-transporting light-emitting material in an interface region of the entire light-emitting layer on the anode side (concentration of hole-transporting light-emitting material in interface region on cathode side/concentration of hole-transporting light-emitting material in interface region on anode side) is from 0% to 30%.

2. The organic electroluminescence element according to claim 1, wherein the concentration of the hole-transporting light-emitting material in the light-emitting layer is 10% by weight or less in the interface region of the light-emitting layer on the cathode side.

3. The organic electroluminescence element according to claim 1, wherein the hole-transporting light-emitting material is a phosphorescent light-emitting material.

4. The organic electroluminescence element according to claim 3, wherein the hole-transporting light-emitting material is an Ir complex.

5. The organic electroluminescence element according to claim 1, wherein the electron-transporting host material is a Be complex, an Al complex, a Ga complex, a Zn complex, a Pt complex, a Pd complex or a nitrogen-containing aromatic heterocyclic compound.

6. The organic electroluminescence element according to claim 1, wherein a concentration of the electron-transporting host material in the light-emitting layer decreases from the cathode side toward the anode side.

7. The organic electroluminescence element according to claim 6, wherein a ratio of the concentration of the electron-transporting host material in an interface region of the light-emitting layer on the anode side relative to the concentration of the electron-transporting host material in an interface region of the light-emitting layer on the cathode side (concentration of electron-transporting host material in interface region on anode side/concentration of electron-transporting host material in interface region on cathode side) is from 0% to 90%.

8. The organic electroluminescence element according to claim 7, wherein the concentration of the electron-transporting host material in the light-emitting layer is 90% by weight or less in the interface region of the light-emitting layer on the anode side.

9. The organic electroluminescence element according to claim 8, wherein the hole-transporting light-emitting material is a phosphorescent light-emitting material.

10. The organic electroluminescence element according to claim 9, wherein the hole-transporting light-emitting material is an Ir complex.

11. The organic electroluminescence element according to claim 6, wherein the electron-transporting host material is a Be complex, an Al complex, a Ga complex, a Zn complex, a Pt complex, a Pd complex or a nitrogen-containing aromatic heterocyclic compound.

12. An organic electroluminescence element comprising an organic layer comprising a light-emitting layer disposed between a pair of electrodes, wherein the light-emitting layer comprises at least one hole-transporting light-emitting material and at least one electron-transporting host material, and a concentration of the hole-transporting light-emitting material in the light-emitting layer decreases stepwise from an anode side toward a cathode side;
   wherein the at least one hole-transporting light-emitting material and the at least one electron-transporting host material are simultaneously present at the entire light-emitting layer, and a concentration of the at least one hole-transporting light-emitting material decreases stepwise from an anode side toward a cathode side within the entire light-emitting layer at which the at least one hole-transporting light-emitting material and the at least one electron-transporting host material are simultaneously present; and
   wherein a ratio of the concentration of the hole-transporting light-emitting material in an interface region of the entire light-emitting layer on the cathode side relative to the concentration of the hole-transporting light-emitting material in an interface region of the entire light-emitting layer on the anode side (concentration of hole-transporting light-emitting material in interface region on cathode side/concentration of hole-transporting light-emitting material in interface region on anode side) is from 0% to 30%.

13. An organic electroluminescence element comprising an organic layer comprising a light-emitting layer disposed between a pair of electrodes, wherein the light-emitting layer comprises at least one hole-transporting light-emitting material and at least one electron-transporting host material, and a concentration of the hole-transporting light-emitting material in the light-emitting layer decreases in a wave pattern from an anode side toward a cathode side;

wherein the at least one hole-transporting light-emitting material and the at least one electron-transporting host material are simultaneously present at the entire light-emitting layer, and a concentration of the at least one hole-transporting light-emitting material decreases in a wave pattern from an anode side toward a cathode side within the entire light-emitting layer at which the at least one hole-transporting light-emitting material and the at least one electron-transporting host material are simultaneously present; and wherein a ratio of the concentration of the hole-transporting light-emitting material in an interface region of the entire light-emitting layer on the cathode side relative to the concentration of the hole-transporting light-emitting material in an interface region of the entire light-emitting layer on the anode side (concentration of hole-transporting light-emitting material in interface region on cathode side/concentration of hole-transporting light-emitting material in interface region on anode side) is from 0% to 30%.

* * * * *